(12) United States Patent
Valet

(10) Patent No.: US 7,057,921 B2
(45) Date of Patent: Jun. 6, 2006

(54) SPIN BARRIER ENHANCED DUAL MAGNETORESISTANCE EFFECT ELEMENT AND MAGNETIC MEMORY USING THE SAME

(75) Inventor: Thierry Valet, Sunnyvale, CA (US)

(73) Assignee: Grandis, Inc., Milpitas, CA (US)

( * ) Notice: Subject to any disclaimer, the term of this patent is extended or adjusted under 35 U.S.C. 154(b) by 0 days.

(21) Appl. No.: 10/842,973

(22) Filed: May 11, 2004

(65) Prior Publication Data
US 2005/0254286 A1   Nov. 17, 2005

(51) Int. Cl.
*G11C 11/00* (2006.01)
(52) U.S. Cl. ............... 365/158; 365/171; 365/173
(58) Field of Classification Search ............... 365/158, 365/171, 173
See application file for complete search history.

(56) References Cited

U.S. PATENT DOCUMENTS

| | | | | |
|---|---|---|---|---|
| 6,418,048 B1 * | 7/2002 | Sin et al. | ............... | 365/173 |
| 6,847,547 B1 * | 1/2005 | Albert et al. | ............... | 365/173 |
| 2005/0002126 A1 * | 1/2005 | Fujiwara et al. | ......... | 360/324.1 |
| 2005/0063222 A1 * | 3/2005 | Huai et al. | ............... | 365/171 |
| 2005/0106810 A1 * | 5/2005 | Pakala et al. | ............... | 438/257 |
| 2005/0136600 A1 * | 6/2005 | Huai | ............... | 438/296 |

* cited by examiner

Primary Examiner—Van Thu Nguyen
Assistant Examiner—N. Nguyen
(74) Attorney, Agent, or Firm—Sawyer Law Group LLP

(57) ABSTRACT

A method and system for providing a magnetic element that can be used in a magnetic memory is disclosed. The magnetic element includes first pinned, spacer, free, spin barrier, and second pinned layers. The spacer layer is nonmagnetic and resides between the pinned and free layers. The free layer can be switched using spin transfer when a write current is passed through the magnetic element. The free layer resides between the spacer and spin barrier layers. The spin barrier layer is between the free and second pinned layers. The spin barrier layer is configured to reduce an outer surface contribution to the free layer damping constant. In one aspect, the spin barrier layer has a high areal resistance and may substantially eliminate spin pumping induced damping. In another aspect, the magnetic element also includes a spin accumulation layer between the spin barrier and free layers. The spin accumulation layer has a high conductivity and may have a long spin diffusion length.

45 Claims, 9 Drawing Sheets

SPIN BARRIER ENHANCED DUAL MAGNETORESISTANCE EFFECT ELEMENT AND MAGNETIC MEMORY USING THE SAME

FIELD OF THE INVENTION

The present invention relates to magnetic memory systems, and more particularly to a method and system for providing a magnetic element that employs a spin transfer effect in switching and that can be switched using a lower switching current density.

BACKGROUND OF THE INVENTION

FIGS. 1A, 1B, and 1C depict conventional magnetic elements 10, 10', and 10" that can be used in magnetic memories. Note that recent reviews of developments in the field of magnetic memories can be found for example in: "Memories of Tomorrow", by William Reohr et al., IEEE Circuits and Devices Magazine, pp. 17–27, September 2002; and "Magnetoresistive Random Access Memory Using Magnetic Tunnel Junctions", by Saied Tehrani et al., Proceedings of the IEEE, vol. 91, no. 5, pp. 703–714, May 2003. The conventional magnetic element 10 is a spin valve and includes a conventional antiferromagnetic (AFM) layer 12, a conventional pinned layer 14, a conventional spacer layer 16 that is conductive and a conventional free layer 18. Other layers (not shown), such as seed or capping layer may also be used. The conventional pinned layer 14 and the conventional free layer 18 are ferromagnetic. Thus, the conventional free layer 18 is depicted as having a changeable magnetization 19. The conventional spacer layer 16 is nonmagnetic. The AFM layer 12 is used to fix, or pin, the magnetization of the pinned layer 14 in a particular direction. The magnetization of the free layer 18 is free to rotate, typically in response to an external magnetic field. Also depicted are top contact 20 and bottom contact 22 that can be used to drive current through the conventional magnetic element 10.

The conventional magnetic element 10' depicted in FIG. 1B is a spin tunneling junction. Portions of the conventional spin tunneling junction 10' are analogous to the conventional spin valve 10. Thus, the conventional magnetic element 10' includes an AFM layer 12', a conventional pinned layer 14', a conventional space layer that is an insulating barrier layer 16' and a conventional free layer 18' having a changeable magnetization 19'. The conventional barrier layer 16' is thin enough for electrons to tunnel through in a conventional spin tunneling junction 10'.

The conventional magnetic element 10" includes an AFM layer 12', a conventional pinned layer 14", a conventional spacer layer that is a current confined layer 16" and a conventional free layer 18" having a changeable magnetization 19". The conventional current confined layer 16" is an inhomogeneous layer mixing areas of metallic conduction (hereafter termed conductive channels 15), with high resistivity regions (hereafter termed an insulating matrix 17) that may be insulators. The conduction between the ferromagnetic layers 14" and 18" is essentially confined to the conductive channels 15. The conventional magnetic element 10" is thus termed a current confined magnetoresistance effect thin film structure. The conventional magnetic element 10" is more fully described in the context of magnetoresistive hard disk drive read-out heads in: "The Applicability of CPP-GMR Heads for Magnetic Recording", by M. Takagishi et al., IEEE Trans. Magn. 38, 2277 (2002).

Depending upon the orientations of the magnetization 19/19'/19" of the conventional free layer 18/18'/18" and the conventional pinned layer 14/14'/14", respectively, the resistance of the conventional magnetic element 10/10'/10", respectively, changes. When the magnetization 19/19'/19" of the conventional free layer 18/18'/18" is parallel to the magnetization of the conventional pinned layer 14/14'/14", the resistance of the conventional magnetic element 10/10'/10" is low. When the magnetization 19/19'/19" of the conventional free layer 18/18'/18" is antiparallel to the magnetization of the conventional pinned layer 14/14'/14", the resistance of the conventional magnetic element 10/10'/10" is high. To sense the resistance of the conventional magnetic element 10/10'/10", current is driven through the conventional magnetic element 10/10'/10". Typically in memory applications, current is driven in a CPP (current perpendicular to the plane) configuration, perpendicular to the layers of conventional magnetic element 10/10'/10" (up or down, in the z-direction as seen in FIG. 1A, 1B, or 1C). In this configuration, current is driven between the top contact 20, 20', 20" and the bottom contact 22, 22', and 22", respectively.

In order to overcome certain issues associated with magnetic memories having a higher density of memory cells, spin transfer may be utilized to switch the magnetizations 19/19'/19" of the conventional free layers 10/10'/10". Spin transfer is described in the context of the conventional magnetic element 10', but is equally applicable to the conventional magnetic elements 10 and 10". Current knowledge of spin transfer is described in detail in the following publications: J. C. Slonczewski, "Current-driven Excitation of Magnetic Multilayers," Journal of Magnetism and Magnetic Materials, vol. 159, p. L1 (1996); L. Berger, "Emission of Spin Waves by a Magnetic Multilayer Traversed by a Current," Phys. Rev. B, vol. 54, p. 9353 (1996), F. J. Albert, J. A. Katine and R. A. Buhrman, "Spin-polarized Current Switching of a Co Thin Film Nanomagnet," Appl. Phys. Lett., vol. 77, No. 23, p. 3809 (2000), "Conductance and exchange coupling of two ferromagnets separated by a tunneling barrier", by J. Slonczewski, Phys. Rev. B 39, 6995 (1989), and "Observation of spin-transfer switching in deep submicron-sized an low-resistance magnetic tunnel junctions" by Y. Huai et al., Appl. Phys. Lett. 84, 3118 (2004). Thus, the following description of the spin transfer phenomenon is based upon current knowledge and is not intended to limit the scope of the invention.

When a spin-polarized current traverses a magnetic multilayer such as the spin tunneling junction 10' in a CPP configuration, a portion of the spin angular momentum of electrons incident on a ferromagnetic layer may be transferred to the ferromagnetic layer. In particular, electrons incident on the conventional free layer 18' may transfer a portion of their spin angular momentum to the conventional free layer 18'. This transfer of angular momentum can be considered a spin transfer torque acting on the free layer magnetization 19'. As a result, a spin-polarized current can switch the magnetization 19' direction of the conventional free layer 18' if the current density is sufficiently high (approximately $10^7$–$10^8$ A/cm$^2$) and the lateral dimensions of the spin tunneling junction are small (approximately less than two hundred nanometers). The threshold current at which spin transfer induced switching can occur is termed the critical current, $I_c$. In addition, for spin transfer to be able to switch the magnetization 19' direction of the conventional free layer 18', it is generally believed that the conventional free layer 18' should be sufficiently thin, for instance, preferably less than approximately ten nanometers for Co.

Spin transfer based switching of magnetization dominates over other switching mechanisms and becomes observable when the lateral dimensions of the conventional magnetic element 10' are small, in the range of few hundred nanometers. Consequently, spin transfer is suitable for higher density magnetic memories having smaller magnetic elements 10'.

The phenomenon of spin transfer can be used in the CPP configuration as an alternative to or in addition to using an external switching field to switch the direction of magnetization of the conventional free layer 18/18'/18" of the conventional magnetic element 10/10'/10". For example, in the conventional magnetic element 10', the magnetization 19' of the conventional free layer 18' can be switched from antiparallel to the magnetization of the conventional pinned layer 14' to parallel to the magnetization of the conventional pinned layer 14'. Current is driven from the conventional free layer 18' to the conventional pinned layer 14' (conduction electrons traveling from the conventional pinned layer 14' to the conventional free layer 18'). Alternatively, the magnetization of the free layer 18' can be switched from a direction parallel to the magnetization of the conventional pinned layer 14' to antiparallel to the magnetization of the conventional pinned layer 14' when current is driven from the conventional pinned layer 14' to the conventional free layer 18' (conduction electrons traveling in the opposite direction.

The magnitude of the critical current, $I_c$, can be determined using the prevalent spin transfer spin-torque model described in J. C. Slonczewski, "Current-driven Excitation of Magnetic Multilayers," *Journal of Magnetism and Magnetic Materials*, vol. 159, p. L1–L5 (1996), and further expanded in particular in: "Field dependence of magnetization reversal by spin transfer", by J. Grollier et al., Phys. Rev. B 67, 174402 (2003). According to Slonczewski's model, the switching current density $I_c$ for the free layer of a spin transfer stack is proportional to:

$$\alpha t M_s [H_{eff} - 2\pi M_s]/g(\theta)$$

where:

$\alpha$=the phenomenological Gilbert damping parameter;
t=the thickness of the free layer;
$M_s$=saturation magnetization of the free layer;
$H_{eff}$=effective field for the free layer;
$g(\theta)$ reflects the spin-transfer efficiency The effective field, $H_{eff}$, includes the external magnetic field, shape anisotropy fields, in-plane and out-of-plane (i.e. perpendicular) anisotropies, and dipolar and exchange fields. The perpendicular anisotropy typically arises from crystalline anisotropy. The term $g(\theta)$ depends on the relative angular orientations of the magnetizations of the conventional pinned layer 14' and the conventional free layer 18'.

Thus, the critical current $I_c$ is proportional to the Gilbert damping parameter a of the conventional free layer 18'. This is believed to be equally applicable to spin transfer in conventional spin valve magnetoresistance effect element such as 10 and conventional current confined magnetoresistance effect element 10". The Gilbert damping parameter $\alpha$ is a dimensionless parameter, which quantifies the level of dynamic damping experienced by the conventional free layer magnetization 18'. Assuming the remaining factors remain the same, a reduction in a results in a proportional reduction of $I_c$, while an increase in a results in a proportional increase of $I_c$. For a thin conventional magnetic free layer 18' embedded in a multilayer structure, it has been shown that the total damping coefficient, $\alpha$, can be in general broken into three contributions:

$$\alpha = \alpha^0 + (\delta\alpha^{out} + \delta\alpha^{in}) t_0 / t_F$$

where:

$\alpha^0$=the intrinsic damping parameter;
$\delta\alpha^{out}$=surface contribution originating from processes taking place at the outer interface of the free layer, for example between the conventional free layer 18' and the top contact 20';
$\delta\alpha^{in}$=surface contribution originating from processes taking place at the inner interface of the free layer, for example between the conventional free layer 18' and the barrier layer 16';
$t_0$=arbitrary scaling length;
$t_F$=thickness of the free layer expressed in nanometers The intrinsic damping parameter $\alpha^0$ is dependent only on the material used to create the conventional free layer 18'. The arbitrary scaling length, $t_0$, is conveniently taken equals to three nanometers without loss of generality. The thickness of the conventional free layer 18', $t_F$, is the thickness of the free layer expressed in nanometers.

The inner surface contribution to the damping parameter, $\delta\alpha^{in}$, depends on the detail of the structure and composition of the interface between the conventional free layer 18' and conventional barrier layer 16', the conventional barrier layer 16' itself, possibly the interface between the conventional barrier layer 16' and the conventional pinned layer 14', and the conventional pinned layer 14'. In particular, the magnetic element 10' may experience a significant and detrimental contribution of $\delta\alpha^{out}$ that can be traced back to "spin pumping" taking place at the top (outer) interface of the free layer 10'. Spin pumping damping is generated by losses of angular momentum from the time dependent magnetization of the conventional free layer 18' by exchange coupling with the free electrons able to leave the free layer into the top contact 20'. Such effects are described in details for example in: "Dynamic stiffness of spin valves" Y. Tserkovnyak et al., Phys. Rev. B 67, 140404 (R) (2003). Such spin pumping induced damping is a limiting factor in the ability to decrease $I_c$ to desirable levels for magnetoresistance effect thin film structures as known in the prior art, with free layer thickness typically ranging from one to five nanometers.

Thus, although spin transfer functions as a mechanism for switching the conventional magnetic elements 10/10'/10", one of ordinary skill in the art will readily recognize that a high current density is typically required to induce switching for the conventional magnetic elements 10/10'/10". In particular, the switching current density is on the order of a few $10^7$ A/cm$^2$ or greater. Thus, a high write current is used to obtain the high switching current density. The high operating current leads to design problems for high density MRAM, such as heating, high power consumption, large transistor size, as well as other issues.

One of ordinary skill in the art will readily recognize that one mechanism for reducing the switching current is to employ a dual magnetoresistive element. FIG. 2 depicts a conventional dual magnetoresistance element 50. The dual magnetoresistance element 50 includes an AFM layer 52, a first conventional pinned layer 54, a first conventional spacer layer 56, a conventional free layer 58, a second conventional spacer layer 60, a second conventional pinned layer 62, and a second AFM layer 64. Other layers (not shown), such as seed or capping layer may also be used. A bottom contact 66 and a top contact 68 are also shown. The conventional pinned layers 54 and 62 and the conventional free layer 58 are ferromagnetic. Thus, the conventional free layer 58 is depicted as having a changeable magnetization 59. The conventional spacer layers 56 and 60 are nonmagnetic. The conventional spacer layer 56 and 60 could be conductive, tunneling barrier layers, or current confined layers. Thus, the conventional spacer layers 56 and 60 correspond to the layers 16, 16', and/or 16" depicted in FIGS. 1A–1C. Referring back to FIG. 2, the AFM layers 52 and 64 are used to fix, or pin, the magnetization of the pinned layers 54 and 62, respectively, in a particular direction. The magnetization of the free layer 58 is free to rotate, typically in response to an external magnetic field.

When a spin-polarized current traverses the conventional magnetic element 50, the magnetization 59 of the free layer 58 can be switched using spin transfer. Angular momentum is carried by the electrical current between the first conventional pinned layer 54 and the conventional free layer 58. This current generates a first spin transfer torque, T1, that acts on the conventional free layer 58. Angular momentum is also carried by the electric current between the second conventional pinned layer 62 and the conventional free layer 58. This current generates a second spin transfer torque, T2, that also acts on the conventional free layer 58. With proper choices of the layer thicknesses, composition, and magnetization orientation of the pinned layers 54 and 62, it is possible to create a conventional magnetic element 50 in which the two torques T1 and T2 add in the desired fashion. As a result, a significant reduction in the critical current $I_c$ might be obtained.

Although the critical current, $I_c$, can be reduced, one of ordinary skill in the art will readily recognize that such conventional magnetic elements 50 can suffer from drawbacks that adversely affect the performances of the conventional magnetic element 50 and magnetic memory that can eventually be built out of it.

First, presume that the second conventional spacer layer 60 is a conductor. As discussed above, the critical current $I_c$ is proportional to the Gilbert damping parameter $\alpha$ of the conventional free layer 58. As indicated above, $\alpha$ can be broken into $\alpha^0$, $\delta\alpha^{out}$, and $\delta\alpha^{in}$. A conventional magnetic element 50 utilizing a second conventional spacer layer 60 that is metallic experiences a significant and detrimental additional contribution from $\delta\alpha^{out}$ that can be traced back to "spin pumping" taking place at the top interface of the free layer 58 in conjunction with the second magnetic pinned layer 62. Such "spin pumping" is analogous to the spin pumping described above.

If the second conventional spacer layer 60 is a tunnel barrier, "spin pumping" at the interface between the free layer 58 and the second non conventional spacer layer 60 does not adversely affect the critical current. However, one of ordinary skill in the art will readily recognize that in order for the sub-structure composed of the free layer 58, the first conventional spacer layer 56, and the first conventional pinned layer 54 to maximize the magnetoresistance effect of the conventional magnetic element 50, the first conventional spacer layer 56 is also a tunnel barrier and that the areal resistance of the second spacer layer 60 is significantly smaller than the areal resistance of the first tunnel barrier 56. In such a conventional dual spin tunneling junction 50, the areal resistance of the second conventional spacer layer 60 is typically ten times smaller than the areal resistance of the first conventional spacer layer 56. Furthermore, for the conventional magnetic element 50 to be capable of being written to using spin transfer, even the first conventional spacer layer 56 has a relatively small areal resistance, typically below twenty $\Omega.\mu m^2$. To manufacture such a conventional magnetic element 50 including two tunneling barriers 56 and 60 with such low areal resistances is very difficult. Consequently, would be highly desirable to identify an alternate design for dual magnetoresistance effect thin film structures, allowing to suppress the spin pumping contribution to $\delta\alpha^{out}$ without requiring the stacking of two low areal resistance magnetic tunnel junctions.

Finally, if the second conventional spacer layer 60 is a current confined layer and if the areal resistance of the interface between the conventional free layer 58 and the second conventional spacer layer 60 is larger than 0.1 $\Omega.\mu m^2$, then it can be shown that the spin pumping contribution to the dynamic damping for the conventional free layer 58 is effectively suppressed. However, for conventional values of the various material and geometrical parameters defining such a conventional magnetic element 50, it can be determined using the magneto-electronic circuit theory that the overall spin transfer torque created on the conventional free layer 58 for a given current I flowing between the two contact electrodes 66 and 68, is only larger by a factor of three to four by comparison with a simple magnetoresistance effect film structure as depicted on FIGS. 1A–1C. One can find a detailed description of the magneto-electronic circuit theory, and some of it's applications to spin transfer in the following publication: A. Brataas, Y. V. Nazarov, and G. E. W. Bauer, "Finite-Element Theory of Transport in Ferromagnet—Normal Metal Systems", in Phys. Rev. Lett. 84, 2481 (2000). It is thus desirable to create improved dual magnetoresistance effect thin film structures that exhibits even larger spin transfer torque on the conventional free layer 58 for the same current.

Accordingly, what is needed is a system and method for providing a dual magnetoresistance element that can be switched using spin transfer at a lower current and that consumes less power. The present invention addresses such a need.

SUMMARY OF THE INVENTION

The present invention provides a method and system for providing a magnetic element that can be used in a magnetic memory. The magnetic element includes first pinned, spacer, free, spin barrier, and second pinned layers. The spacer layer is nonmagnetic and resides between the pinned and free layers. The free layer can be switched using spin transfer when a write current is passed through the magnetic element. The free layer resides between the spacer layer and the spin barrier layer. The spin barrier layer is between the free layer and the second pinned layer. The spin barrier layer is configured to reduce an outer surface contribution to a damping constant of the free layer. In one aspect, the spin barrier layer has a high areal resistance and may substantially eliminate spin pumping induced damping. In another aspect, the magnetic element also includes a spin accumulation layer between the spin barrier and free layers. The spin accumulation layer is metallic and may have a long spin diffusion length.

According to the system and method disclosed herein, the present invention provides a magnetic element that can be switched due to spin transfer using a lower current density and the attendant advantages of a lower switching current density.

DETAILED DESCRIPTION OF THE INVENTION

Figure 1A:
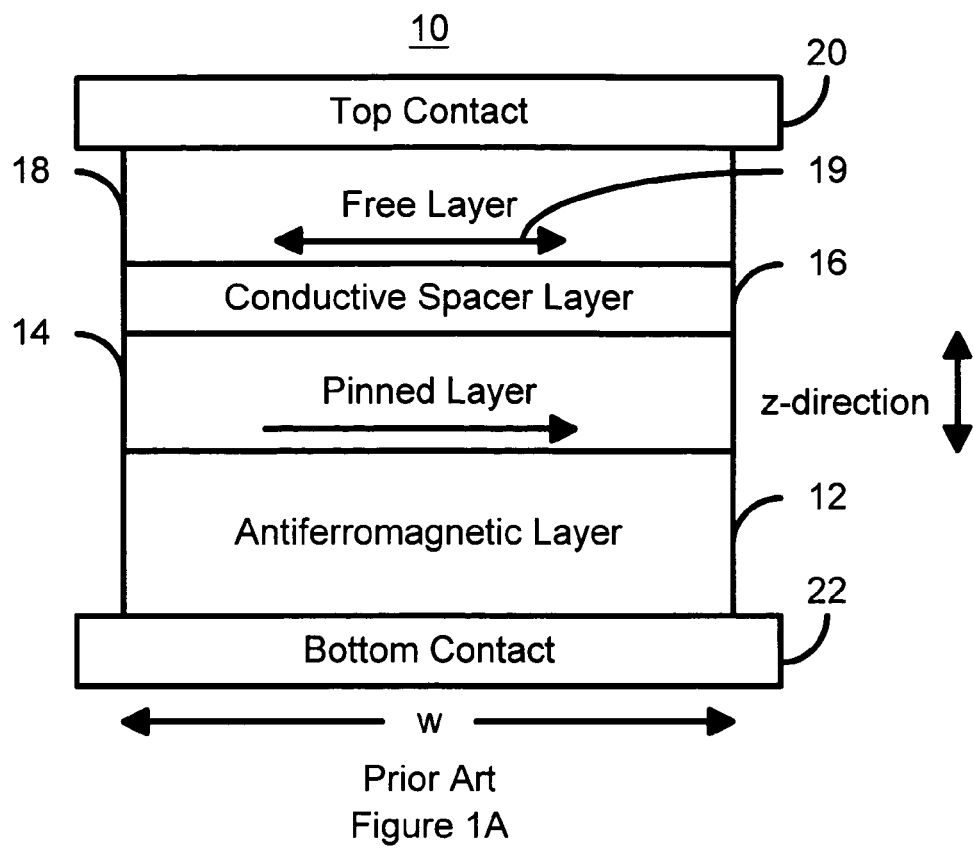
FIG. 1A is a diagram of a conventional magnetic element, a conventional spin valve.

The present invention relates to an improvement in magnetic elements and magnetic memories, such as MRAM. The following description is presented to enable one of ordinary skill in the art to make and use the invention and is provided in the context of a patent application and its requirements. Various modifications to the preferred embodiments will be readily apparent to those skilled in the art and the generic principles herein may be applied to other embodiments. Thus, the present invention is not intended to be limited to the embodiments shown, but is to be accorded the widest scope consistent with the principles and features described herein.

The present invention provides a method and system for providing a magnetic element that can be used in a magnetic memory. The magnetic element includes first pinned, spacer, free, spin barrier, and second pinned layers. The spacer layer is nonmagnetic and resides between the pinned and free layers. The free layer can be switched using spin transfer when a write current is passed through the magnetic element. The free layer resides between the spacer layer and the spin barrier layer. The spin barrier layer is between the free layer and the second pinned layer. The spin barrier layer is configured to reduce an outer surface contribution to a damping constant of the free layer. In one aspect, the spin barrier layer has a high areal resistance and may substantially eliminate spin pumping induced damping. In another aspect, the magnetic element also includes a spin accumulation layer between the spin barrier and free layers. The spin accumulation layer is metallic (e.g. has a high conductivity), and may have a long spin diffusion length.

The present invention will be described in terms of a particular magnetic memory and a particular magnetic element having certain components. However, one of ordinary skill in the art will readily recognize that this method and system will operate effectively for other magnetic memory elements having different and/or additional components and/or other magnetic memories having different and/or other features not inconsistent with the present invention. The present invention is also described in the context of current understanding of the spin transfer phenomenon. Consequently, one of ordinary skill in the art will readily recognize that theoretical explanations of the behavior of the method and system are made based upon this current understanding of spin transfer. One of ordinary skill in the art will also readily recognize that the method and system are described in the context of a structure having a particular relationship to the substrate. For example, as depicted in the drawings, the bottoms of the structures are typically closer to an underlying substrate than the tops of the structures. However, one of ordinary skill in the art will readily recognize that the method and system are consistent with other structures having different relationships to the substrate. In addition, the method and system are described in the context of certain layers being synthetic and/or simple. However, one of ordinary skill in the art will readily recognize that the layers could have another structure. For example, although the method and system are described in the context of simple free layers, nothing prevents the present invention from being used with synthetic free layers. Furthermore, the present invention is described in the context of magnetic elements having particular layers. However, one of ordinary skill in the art will readily recognize that magnetic elements having additional and/or different layers not inconsistent with the present invention could also be used. Moreover, certain components are described as being ferromagnetic. However, as used herein, the term ferromagnetic could include ferrimagnetic or like structures. Thus, as used herein, the term "ferromagnetic" includes, but is not limited to ferromagnets and ferrimagnets. The present invention is also described in the context of single elements. However, one of ordinary skill in the art will readily recognize that the present invention is consistent with the use of magnetic memories having multiple elements, bit lines, and word lines. The present invention is also described in the context of a particular mechanism, a reduced damping constant for the free layer, for providing a lower switching current density. However, one of ordinary skill in the art will readily recognize that the method and system described herein can be combined with other mechanisms for reducing the switching current density, such as a low saturation magnetization free layer.

Figure 3A:
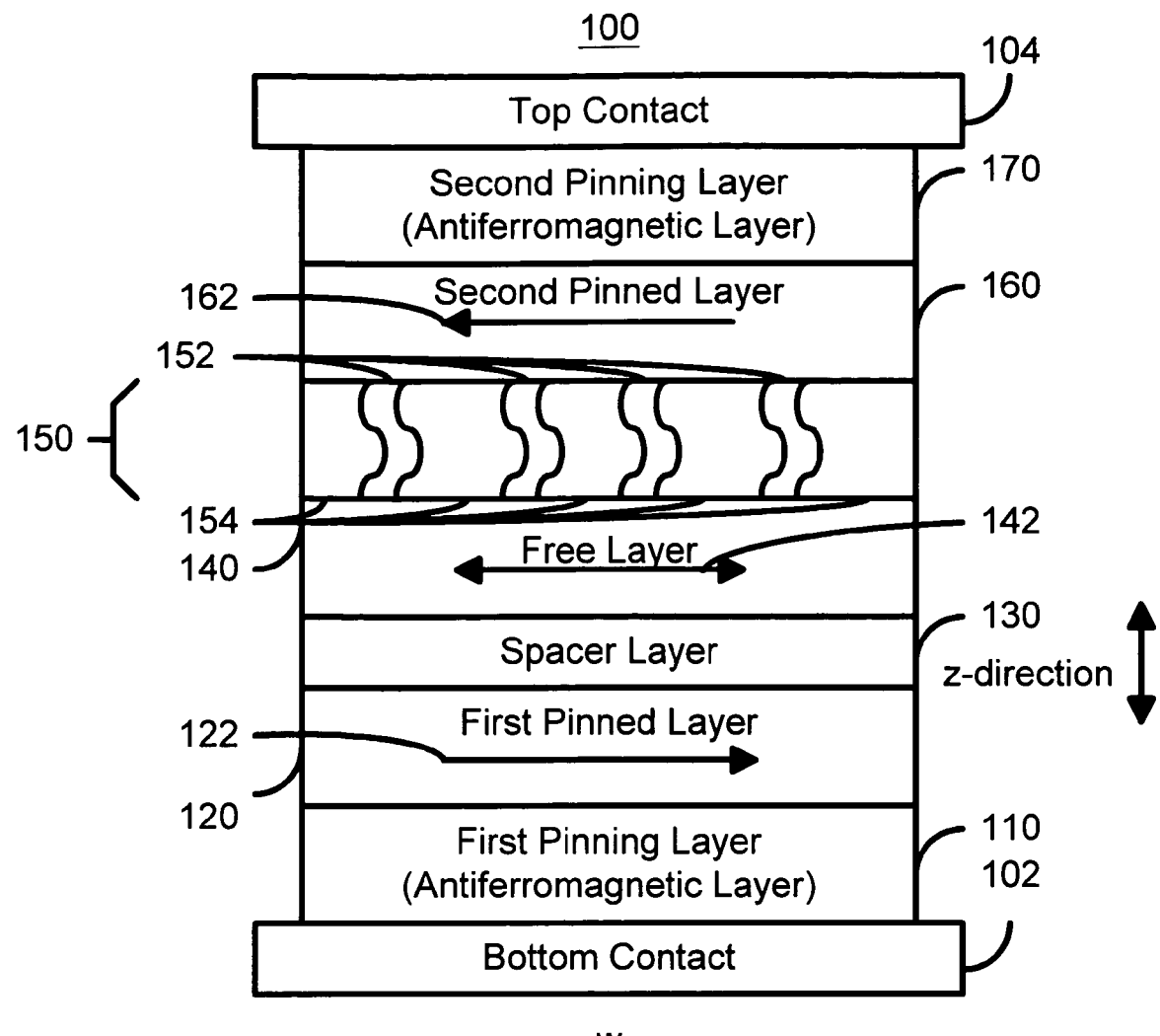
FIG. 3A depicts a first embodiment of a portion of a magnetic element in accordance with the present invention having a reduced write current density for spin transfer switching.

To more particularly illustrate the method and system in accordance with the present invention, refer now to FIG. 3A, depicting a first embodiment of a portion of a magnetic element 100 in accordance with the present invention having a reduced write current density for spin transfer switching. The magnetic element 100 is preferably used in a magnetic memory, such as a MRAM, in a CPP configuration. Thus, the magnetic element 100 may be used in a memory cell including an isolation transistor (not shown), as well as other configurations of magnetic memories. Moreover, the magnetic element 100 preferably utilizes the two terminals 102 and 104 near the top and bottom, respectively, of the magnetic element 100. However, nothing prevents the use of another number of terminals, for example a third terminal near the center of the magnetic element. The magnetic element 100 includes a first pinned layer 120, a spacer layer 130, a free layer 140, and a second pinned layer 160. The magnetic element 100 generally also includes a first pinning layer 110 and a second pinning layer 170 used to pin the magnetization 122 and 162, respectively, of the pinned layers 120 and 160, respectively, as well as seed layers (not shown) and capping layers (not shown). Furthermore, the magnetic element 100 is configured such that the free layer 140 can be written using spin transfer. In a preferred embodiment, the lateral dimensions, such as the width w, of the free layer 140 are thus small and preferably less than two hundred nanometers. In addition, some difference is preferably provided between the lateral dimensions to ensure that the free layer 140 has a particular easy axis in the plane of the free layer 140.

Figure 1B:
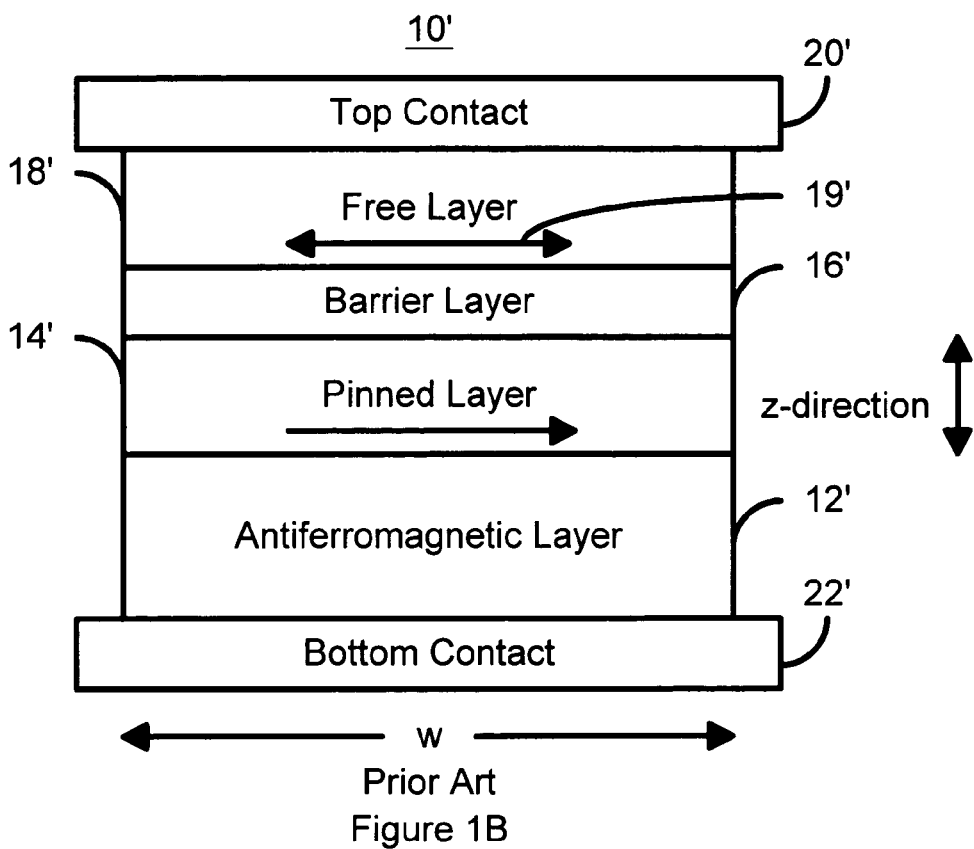
FIG. 1B is a diagram of another conventional magnetic element, a conventional spin tunneling junction.
Figure 1C:
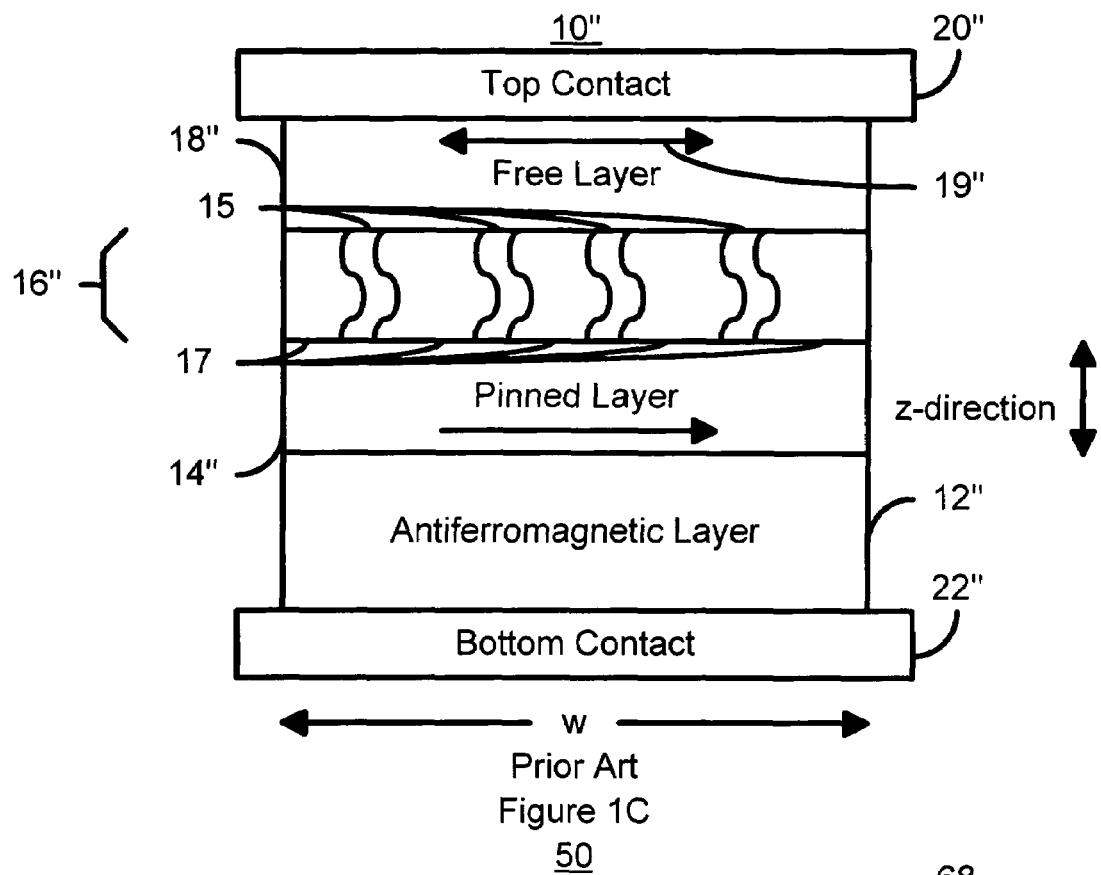
FIG. 1C is a diagram of a third conventional magnetic element, a conventional current confined magnetoresistance effect thin film structure.
Figure 2:
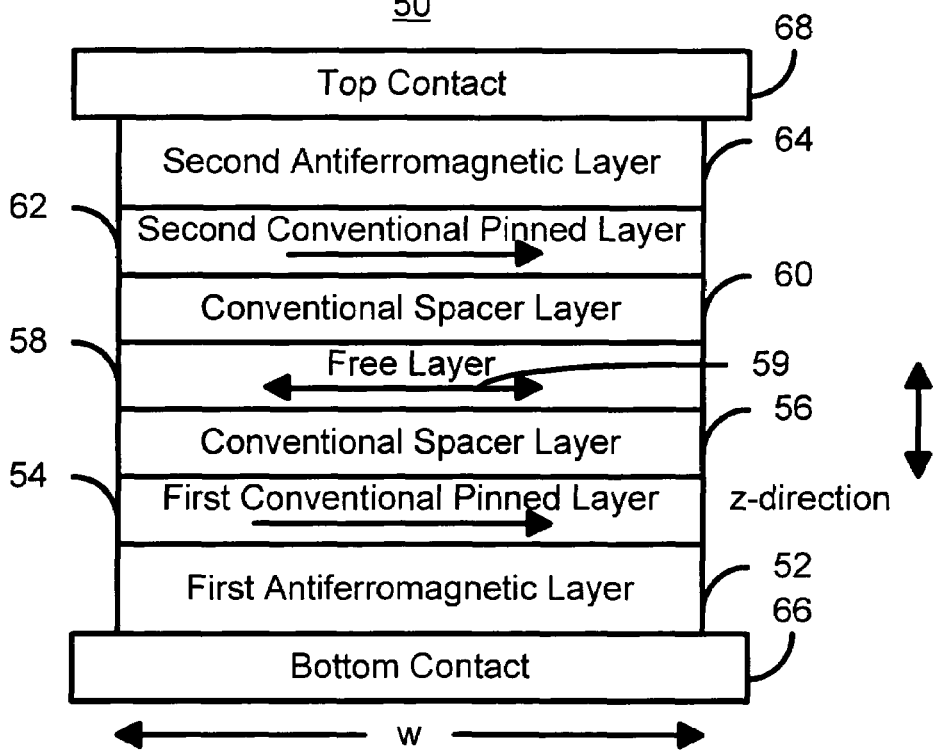
FIG. 2 is a diagram of a conventional dual magnetoresistance magnetic element.

The pinning layers 110 and 170 are preferably AFM layers 110 and 170, respectively, that pin the magnetizations 122 and 162, respectively, of the pinned layers 120 and 160, respectively, through an exchange coupling. Note that although the pinned layer magnetizations 122 and 162 are depicted as being antiparallel, nothing prevents the magnetizations 122 and 162, respectively, from having other orientations. For example, the AFM layer 170 may pin the magnetization 162 of the pinned layer 160 parallel, antiparallel, or perpendicular to the magnetization 122 of the pinned layer 120. The pinned layers 120 and 160 are ferromagnetic. In one embodiment the pinned layer 120 and/or the pinned layer 160 are synthetic. In such an embodiment, the pinned layer 120 and/or the pinned layer 160 includes ferromagnetic layers separated by nonmagnetic layers and is configured such that the ferromagnetic layers are aligned antiparallel. The pinned layers 120 and/or 160 may have other features used to improve the performance of the magnetic element 100. The spacer layer 130 is nonmagnetic. In one embodiment, the spacer layer 130 may be conductive, for example including Cu. In another embodiment, the spacer layer 130 is a barrier layer including an insulator such as alumina. In such an embodiment, the barrier layer 130 is configured such that charge carriers can tunnel between the free layer 140 and the pinned layer 120. In another embodiment the spacer layer 130 is a current confined layer. Thus, the spacer layer 130 may correspond to the spacer layers 16, 16', or 16" depicted in FIG. 1A, 1B, or 1C, respectively. Referring back to FIG. 3A, the magnetic element 100 can thus be a current confined magnetoresistance structure.

The free layer 140 is ferromagnetic. As described above, the free layer 140 preferably has some shape anisotropy such that the magnetization 142 of the free layer 140 is stable when either parallel or antiparallel to the magnetization 122 of the pinned layer 120. Furthermore, the free layer 140 may be simple, as depicted in FIG. 3A, or synthetic.

The magnetic element 100 also includes the spin barrier layer 150. The spin barrier layer 150 is configured to reduce an outer surface contribution to the damping constant, $\alpha$, of the free layer. The spin barrier layer 150 preferably has a large areal resistance, $r_b$. In a preferred embodiment, the large areal resistance is at least 0.1 $\Omega\mu m^2$. In the embodiment shown, the spin barrier layer 150 is essentially a current confined layer including conductive channels 152 in an insulating matrix 154. Because of the presence of the spin barrier layer 150 that reduces the outer surface contribution to the damping constant, the critical current at which the magnetization 142 of the free layer 140 switches is reduced.

The effect of the spin barrier layer 150 can be understood using the prevalent spin transfer spin-torque model described above. In particular, the spin barrier layer 150 is used to alter the outer interface of the free layer 140 and thus reduce the contribution of the outer surface contribution to the damping parameter, $\delta\alpha^{out}$, to the total damping parameter. Consequently, the critical current is reduced.

To more particularly describe the reduction in critical current due to the spin barrier layer 150, reference is made to Slonczewski's model. According to this model, the critical current $I_c$ for the free layer of a spin transfer stack is proportional to $\alpha$, the phenomenological Gilbert damping parameter of the free layer 140. As discussed above, for a thin magnetic free layer 140 embedded in a multilayer structure, it has been shown that the total damping coefficient, $\alpha$, can be in general broken into three contributions: $\alpha=\alpha^0+(\delta\alpha^{out}+\delta\alpha^{in})t_0/t_f$.

Because the intrinsic damping parameter, $\alpha^0$, depends upon the material(s) used for the free layer 140, the intrinsic damping parameter is generally unavailable for engineering to reduce the critical current. The surface contribution to the damping parameter, $\delta\alpha^{in}$, depends on the detail of the structure and composition of the interface between the free layer 140 and first spacer layer 130, the first spacer layer 130 itself, possibly the interface between the first spacer layer 130 and the first pinned layer 120, and the first pinned layer 120. The composition and structure of these various elements 120, 130, and 140 are generally optimized in regards with various other constraints. In particular, the free layer 140, first spacer layer 130, and first pinned layer 120 are generally configured to optimize the resistance of that portion of the magnetic element 100 and to adjust the areal resistance of the magnetic element 100 in a desired proper range, as well as other constraints. Consequently, the resulting $\delta\alpha^{in}$ in is generally taken as is.

On the other hand, it is possible to alter the outer interface of the free layer 140. In particular, the spin barrier layer 150 is used to alter the outer interface of the free layer 140 and thus reduce the contribution of the outer surface contribution to the damping parameter, $\delta\alpha^{out}$, to the total damping parameter. In the context of the present application, a reduction in the outer surface contribution to the damping parameter ensures that this contribution, $\delta\alpha^{out}$, is less than for the free layer 140 alone.

In a preferred embodiment of the invention, the spin barrier layer 150 has a large areal resistance, $r_b$, at least 0.1 $\Omega\mu m^2$. Such a high areal resistance reduces the coupling between the time dependent magnetization of the free layer 140 and the conduction electrons in the outer electrode 104, across the spin barrier layer 150. Consequently, this coupling may no longer contribute significantly to the damping of the magnetization of the free layer 150. Stated differently, the high areal resistance of the spin barrier layer 150 results in an effective cancellation of the spin pumping induced additional damping and, therefore, a reduction in the surface contribution to the damping parameter, $\delta\alpha^{out}$. Consequently, a beneficial reduction in the critical current magnitude $I_c$ required to switch the free layer magnetization 142 is achieved. Thus, the dual magnetoresistance element 100 has a further reduced critical current.

In the magnetic element 100 depicted in FIG. 3A, the spin barrier layer 150 is a current confined spin barrier layer. The spin barrier layer 150 is a thin layer inhomogeneous across the plane of the layer 150. The spin barrier layer 150 thus has areas of metallic (ohmic) conduction, termed conductive channels 152, and areas of high resistivity, termed an insulating matrix 154. The insulating matrix 154 may actually be insulating areas or may simply have a resistivity that is high in comparison to the conductive channels 152. As a result, conduction of current through the spin barrier layer 150 is primarily confined to the conductive channels 152. In a magnetic element 100, the areal resistance of the spin barrier layer 150 can be adjusted by varying the size and density of the conductive channels 152, allowing the targeted specification for $r_b$ to be met relatively easily.

In a preferred embodiment of the magnetic element 100, the current confined spin barrier layer 150 has a thickness that is preferably between 0.2 and 5 nm. Also in a preferred embodiment, the spin barrier layer 150 is made in large part from an oxide of one of more materials selected from a group consisting of Al, B, Si, Ge, W, Nb, Mo, Ta, V, Ti, Cr, Fe, Co, and Ni. The conductive channels 152 may correspond to areas of lower atomic concentration in oxygen. In a preferred embodiment to areas of oxygen atomic concentration below thirty percent are considered to be the conductive channels 152. The areas of high resistivity, the insulating matrix 154, may correspond to areas of higher atomic concentration in oxygen. In a preferred embodiment, the insulating matrix 154 corresponds to areas of atomic oxygen concentration above forty percent. Moreover, the lateral fluctuation in oxygen atomic concentration across the spin barrier layer 150 are preferably induced by addition to the spin barrier layer 150 of metallic element(s), or oxygen segregation agent, that does not oxidize easily. For example, the conductive channels 152 may include element(s) selected from the group consisting of Cu, Ag, Au, Pt, Pd, Ir, and Os.

In an alternate embodiment of the current confined spin barrier layer 150, the current confined spin barrier layer 150 preferably has a thickness comprised between 0.2 and 5 nm. Also in such an embodiment, the spin barrier layer 150 is made in large part from a nitride of elements (the matrix elements) selected from the group consisting of Al, B, Si, Ge, Ti. The conductive channels 152 correspond to areas of lower atomic concentration in nitrogen. In a preferred embodiment, the conductive channels 152 correspond to areas of nitrogen atomic concentration below thirty percent. The insulating matrix 154 corresponds to areas of high resistivity, preferably where the atomic nitrogen concentration is above forty percent. Moreover, the lateral fluctuations in nitrogen atomic concentration across the spin barrier layer 150 are preferably induced by addition to the spin barrier layer 150 of a metallic element, or the nitrogen segregation agent, that does not react easily with nitrogen. For example, element(s) selected from the group consisting of Cu, Ag, Au, Pt, Pd, Ir, and Os.

In operation, different currents for reading and writing are used. During reading, the lower read current is utilized. For example, a current of between one and five hundred microamperes may be used as the read current. Such a read current allows the state of the magnetic element 100 to be determined yet does not result in spin transfer induced switching of the free layer 140. During writing, a write current that is at least equal to the critical current, $I_c$, is applied in the appropriate direction (i.e. up or down in FIG. 3A) to write to the magnetic element 100. Thus, the magnetization 142 of the free layer 140 can be switched to be parallel or antiparallel to the magnetization 122 of the pinned layer 120. Such a write current may be between ten and two thousand microamperes.

Thus, the spin barrier layer 150 reduces an outer surface contribution to the damping constant, $\alpha$, of the free layer. As a result, the critical current at which the magnetization 142 of the free layer 140 switches is reduced. Consequently, performance of the magnetic element 100 can be improved.

Figure 3B:
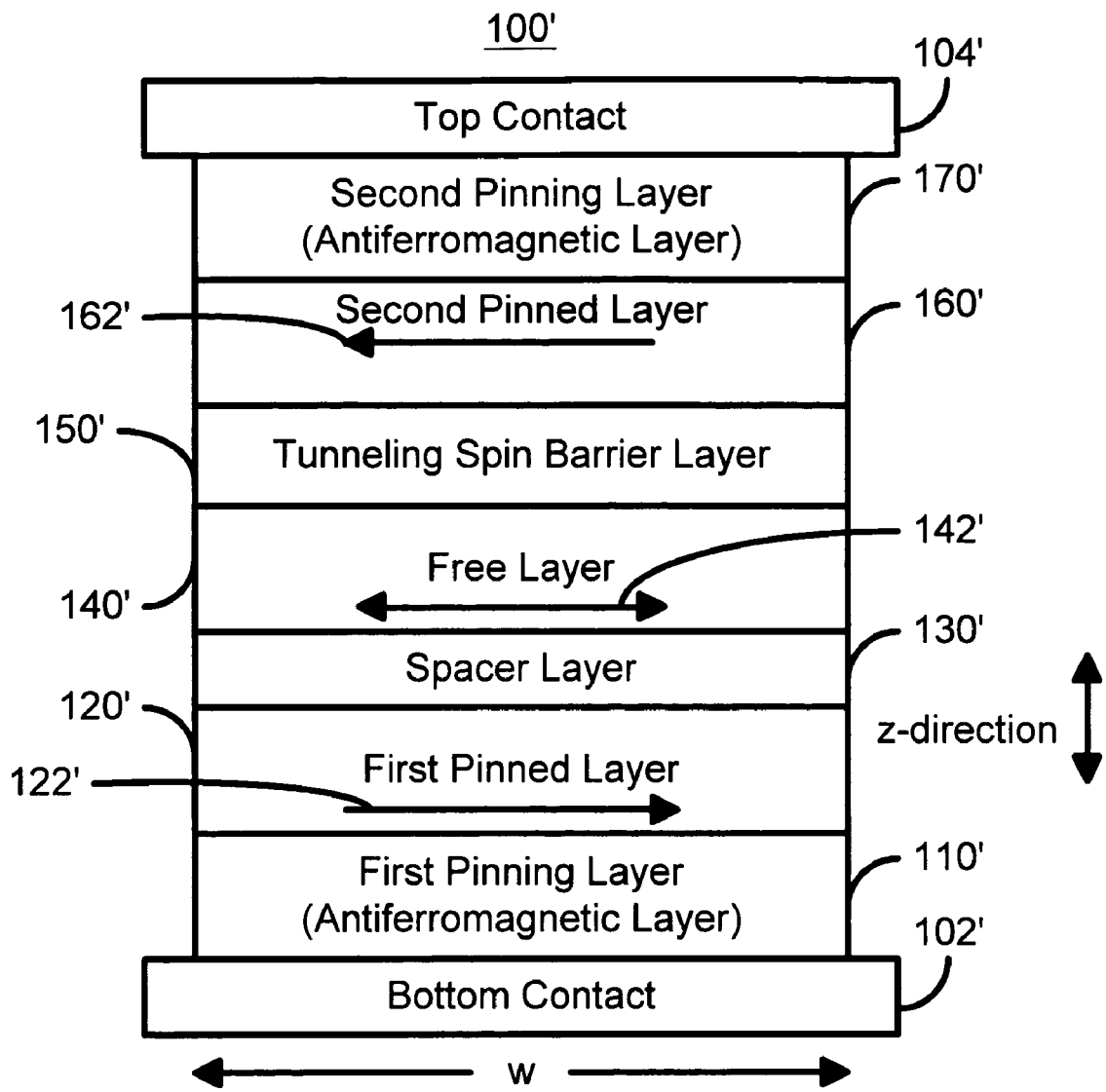
FIG. 3B depicts another version of the first embodiment of a portion of a magnetic element in accordance with the present invention having a reduced write current density for spin transfer switching.

FIG. 3B depicts another version of the first embodiment of a portion of a magnetic element 100' in accordance with the present invention having a reduced write current density for spin transfer switching. Components of the magnetic element 100' are analogous to the magnetic element 100. Consequently, portions of the magnetic element 100' are labeled similarly to the magnetic element 100. Thus, the magnetic element 100' includes a first pinning layer 110' that is preferably an AFM layer, pinned layer 120', a spacer layer 130', a free layer 140', a spin barrier layer 150', a second pinned layer 160', and a second pinning layer 170' that is preferably an AFM layer. Current is preferably driven in a CPP configuration using electrodes 102' and 104'. The spacer layer 130' may take on various forms, including a conductive layer, a tunneling barrier layer, or a current confined layer. Thus, the layers of the magnetic element 100' are substantially the same as and function in an analogous manner to the layers of the magnetic element 100.

Although the spin barrier layer 150' functions in an analogous manner to the spin barrier layer 150, the structure of the spin barrier layer 150 is different. In particular, the spin barrier layer 150' is a tunneling barrier that includes a thin insulating, a semiconducting layer, or other analogous layer. Conduction of current through the spin barrier layer 150' is thus allowed by electronic tunneling, electron hoping and/or thermally activated conduction. In such a magnetic element 100', the areal resistance of the spin barrier layer 150' may be adjusted by varying the thickness and composition of the spin barrier layer 150'. Thus, the targeted specification for $r_b$ may be met.

In a preferred embodiment of the magnetic element 100', the spin barrier layer 150' has a thickness between 0.2 and 5 nm. Also in a preferred embodiment, the spin barrier layer is in large part comprised of an oxide of elements selected from the group consisting of Al, B, Si, Ge, W, Nb, Mo, Ta, V, Ti, Cr, Fe, Co, or Ni. In an alternate embodiment of the magnetic element 100', the spin barrier layer 150' has a thickness comprised between 0.2 and 5 nm, and is made in large part from a nitride of element(s) selected from the group consisting of A, B, Si, Ge, Ti. In yet another embodiment, the spin barrier layer 150' is made in large part from a semiconductor material. In such a magnetic element 100', the spin barrier layer 150' preferably has a thickness of between 0.2 and 5 nm. The semiconductor material used in such an embodiment is preferably made out of element(s) selected from the group constituted Si, Ge, Ga, Cd, Te, Sb, In, Al, As, Hg, and C.

The spin barrier layer 150' reduces an outer surface contribution to the damping constant, $\alpha$, of the free layer. Because the spin barrier layer 150' reduces the outer surface contribution to the damping constant in a manner analogous to that described above, the critical current at which the magnetization 142' of the free layer 140' switches is reduced. Consequently, performance of the magnetic element 100' can be improved.

Figure 3C:
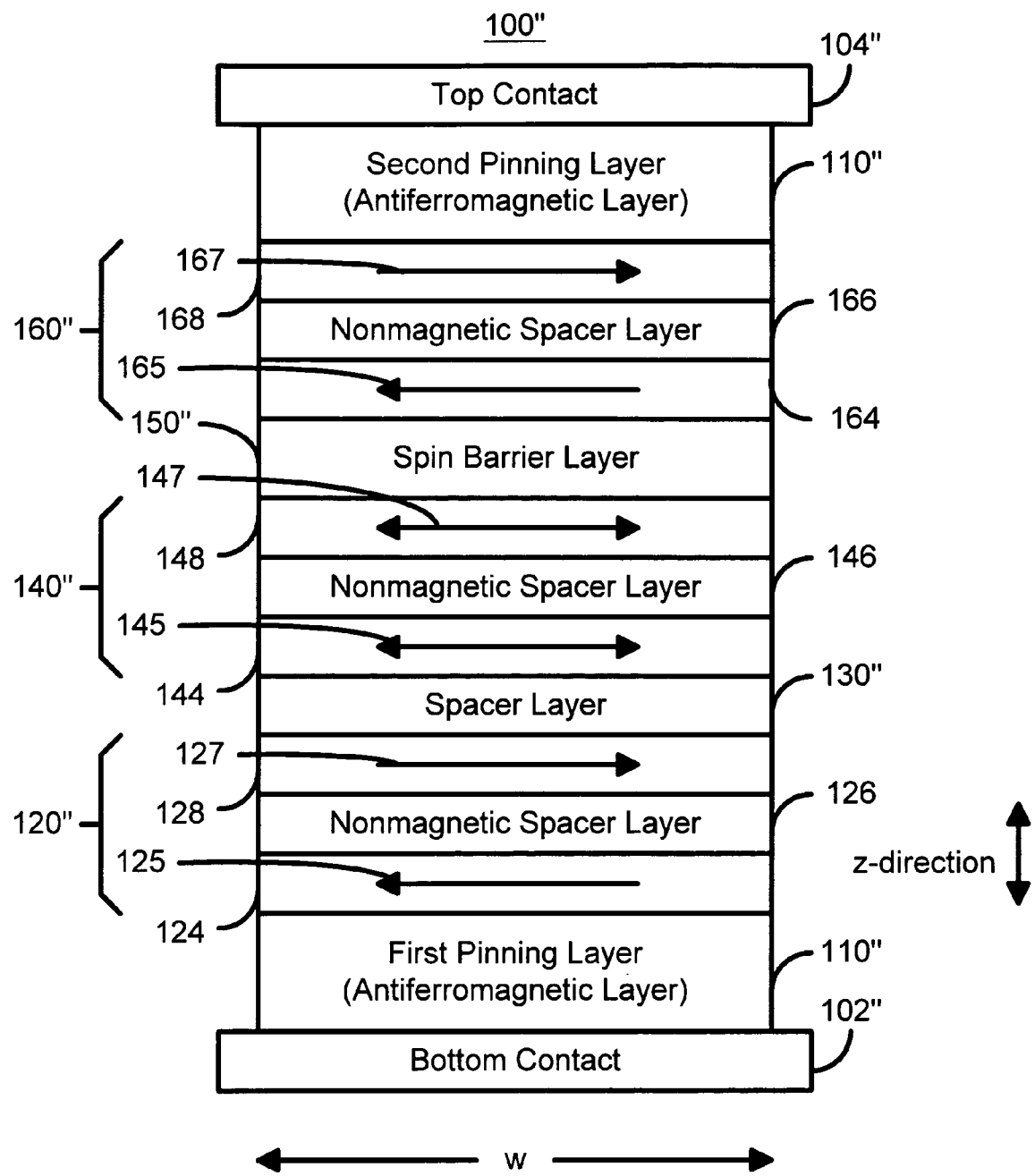
FIG. 3C depicts a third version of the first embodiment of a portion of a magnetic element in accordance with the present invention having a reduced write current density for spin transfer switching.

FIG. 3C depicts a third version of the first embodiment of a portion of a magnetic element 100" in accordance with the present invention having a reduced write current density for spin transfer switching. Components of the magnetic element 100" are analogous to the magnetic element 100. Consequently, portions of the magnetic element 100" are labeled similarly to the magnetic elements 100 and 100'.

Thus, the magnetic element 100" includes a first pinning layer 110" that is preferably an AFM layer, a first pinned layer 120", a spacer layer 130", a free layer 140", a spin barrier layer 150", a second pinned layer 160", and a second pinning layer 170" that is preferably an AFM layer. Current is preferably driven in a CPP configuration using electrodes 102" and 104". The spacer layer 130" may take on various forms, including a conductive layer, a tunneling barrier layer, or a current confined layer. Thus, the layers of the magnetic element 100" are substantially the same as and function in an analogous manner to the layers of the magnetic element 100 and 100'.

The spin barrier layer 150" may be a current confined spin barrier layer, such as the spin barrier layer 150, or a tunneling spin barrier layer, such as the spin barrier layer 150'. Thus, the spin barrier layer 150" functions in a similar manner to the spin barrier layers 150 and 150'. However, in the magnetic element 100" shown, the pinned layers 120" and 160" and the free layer 140" are synthetic. Consequently, the first pinned layer 120" includes ferromagnetic layers 124 and 128 separated by a nonmagnetic spacer layer 126 that is preferably Ru. The nonmagnetic spacer layer 126 is configured so that the magnetizations 125 and 127 of the ferromagnetic layers 124 and 128, respectively, are antiferromagnetically coupled. The second pinned layer 160" includes ferromagnetic layers 164 and 168 separated by a nonmagnetic spacer layer 166 that is preferably Ru. The nonmagnetic spacer layer 166 is configured so that the magnetizations 165 and 167 of the ferromagnetic layers 164 and 168, respectively, are antiferromagnetically coupled. Similarly, the free layer 140" includes ferromagnetic layers 144 and 148 separated by a nonmagnetic spacer layer 146 that is preferably Ru. The nonmagnetic spacer layer 146 is configured so that magnetizations 145 and 147 of the ferromagnetic layers 144 and 148, respectively, are antiferromagnetically coupled.

Thus, in a manner analogous to that described above, the spin barrier layer 150" reduces an outer surface contribution to the damping constant, cx, of the free layer 140". As a result, the critical current at which the magnetization 142" of the free layer 140" switches is reduced. Consequently, performance of the magnetic element 100" can be improved.

Figure 4A:
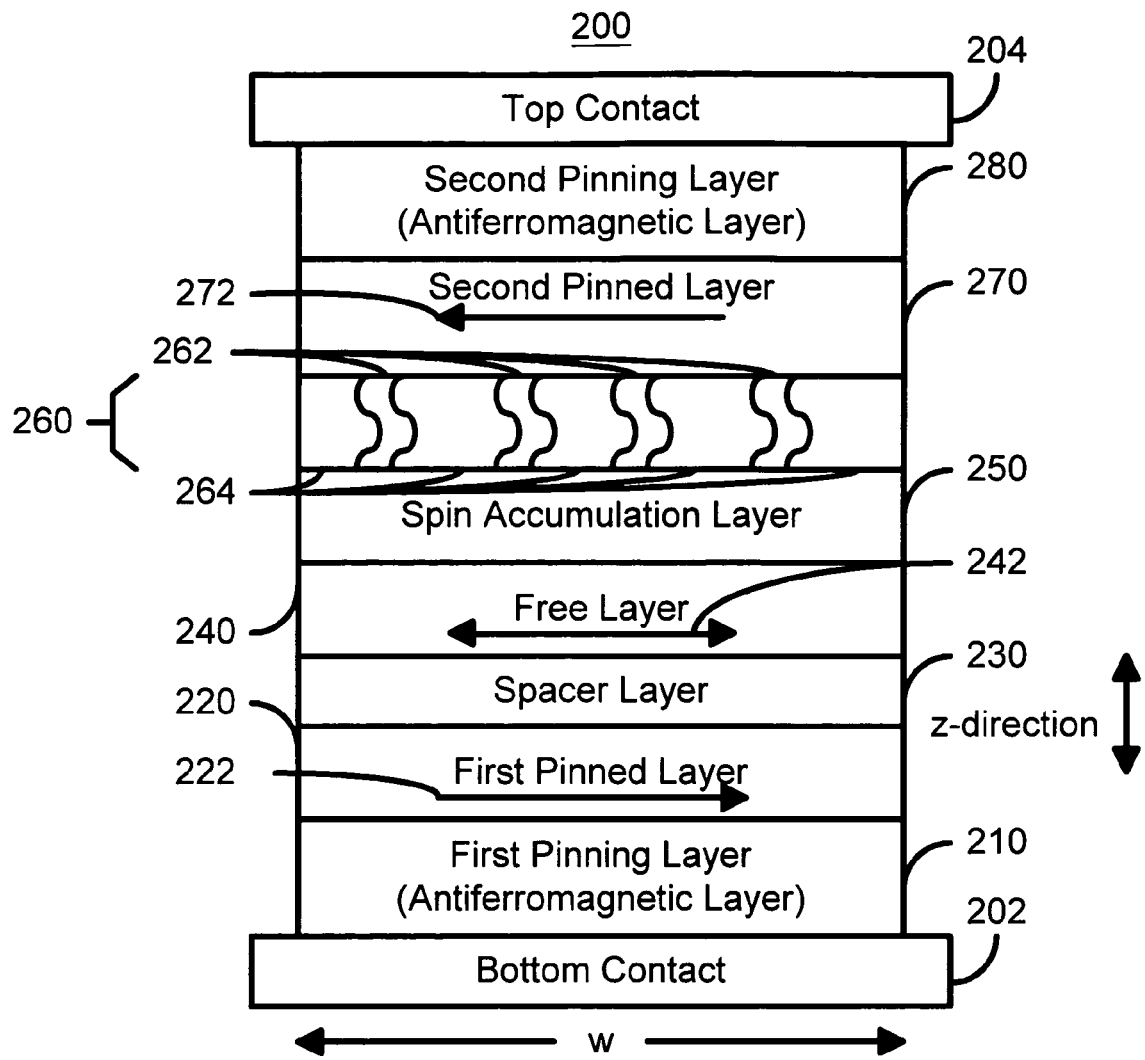
FIG. 4A depicts a second embodiment of a portion of a magnetic element in accordance with the present invention having a reduced write current density for spin transfer switching.

FIG. 4A depicts a second embodiment of a portion of a magnetic element 200 in accordance with the present invention having a reduced write current density for spin transfer. The magnetic element 200 is preferably used in a magnetic memory, such as a MRAM, in a CPP configuration. Thus, the magnetic element 200 may be used in a memory cell including an isolation transistor (not shown), as well as other configurations of magnetic memories. Moreover, the magnetic element 200 preferably utilizes the two terminals 202 and 204 near the top and bottom, respectively, of the magnetic element 200. However, nothing prevents the use of another number of terminals, for example a third terminal near the center of the magnetic element. The magnetic element 200 includes a first pinned layer 220, a spacer layer 230, a free layer 240, a spin accumulation layer 250, a spin barrier layer 260, and a second pinned layer 270. The magnetic element 200 generally also includes a first pinning layer 210 used to pin the magnetization 222 of the first pinned layer 220, a second pinning layer 280 used to pin the magnetization 272 of the second pinned layer 270, as well as seed layers (not shown) and capping layers (not shown). Furthermore, the magnetic element 200 is configured such that the free layer 240 can be written using spin transfer. In a preferred embodiment, the lateral dimensions, such as the width w, of the free layer 240 are thus small and preferably less than two hundred nanometers. In addition, some difference is preferably provided between the lateral dimensions to ensure that the free layer 240 has a particular easy axis in the plane of the free layer 240.

The pinned layers 220 and 270 are ferromagnetic. In one embodiment the first pinned layer 220 and/or the second pinned layer 270 are synthetic. In such an embodiment, the first pinned layer 220 and/or the second pinned layer 270 may include ferromagnetic layers separated by nonmagnetic layers and is configured such that the ferromagnetic layers are aligned antiparallel. The first pinned layer 220 and/or the second pinned layer 270 may have other features used to improve the performance of the magnetic element 200. The spacer layer 230 is nonmagnetic. In one embodiment, the spacer layer 230 may be conductive, for example including Cu. In another embodiment, the spacer layer 230 is a barrier layer including an insulator such as alumina. In such an embodiment, the barrier layer 230 is configured such that charge carriers can tunnel between the free layer 240 and the pinned layer 220. In another embodiment, the spacer layer 230 is a current confined layer. Thus, the spacer layer 230 may correspond to the spacer layers 16, 16', or 16" depicted in FIGS. 1A, 1B, or 1C, respectively. Referring back to FIG. 4A, the magnetic element 200 can thus be a current confined magnetoresistance structure.

The free layer 240 is ferromagnetic. As described above, the free layer 240 preferably has some shape anisotropy such that the magnetization 242 of the free layer 240 is stable when either parallel or antiparallel to the magnetization 222 of the pinned layer 220. Furthermore, the free layer 240 may be simple, as depicted in FIG. 4A, or synthetic.

The magnetic element 200 also includes the spin accumulation layer 250 and the spin barrier layer 260. The combination of the spin accumulation layer 250 and the spin barrier layer 260 is used to alter the outer interface of the free layer 240 and thus reduce the contribution of the outer surface contribution to the damping parameter, $\delta\alpha^{out}$, to the total damping parameter. Thus, the spin accumulation layer 250 in combination with the spin barrier layer 260 reduce an outer surface contribution to the damping constant, $\alpha$, of the free layer 240. As a result, the critical current at which the magnetization 242 of the free layer 240 switches is reduced. Consequently, performance of the magnetic element 200 can be improved.

The magnetic element 200 also includes the spin accumulation layer 250 and the spin barrier layer 260. The combination of the spin accumulation layer 250 and the spin barrier layer 260 is used to alter the outer interface of the free layer 240 and thus reduce the contribution of the outer surface contribution to the damping parameter, $\Gamma\alpha^{out}$, to the total damping parameter. Thus, the spin accumulation layer 250 in combination with the spin barrier layer 260 reduce an outer surface contribution to the damping constant, $\alpha$, of the free layer 240. As a result, the critical current at which the magnetization 242 of the free layer 240 switches is reduced. Consequently, performance of the magnetic element 200 can be improved.

The function of the spin accumulation layer 250 and the spin barrier layer 260 may be explained as follows. The spin accumulation layer 250 is metallic (e.g. has a high conductivity). Also in a preferred embodiment, the spin accumulation layer 250 has a very long spin flip scattering time, or equivalently a long spin diffusion length. In a preferred embodiment of the invention, the spin accumulation layer 250 is thus made of a very pure, of relatively small atomic weight, and highly conductive metal, such as Al, Cu, or Ag known to exhibit very long spin diffusion length. A typical value for the "long" spin diffusion length in such metal layer at room temperature is above forty nanometers. Further, in a preferred embodiment of the invention, the spin accumulation layer has a thickness between 0.5 nm and 5 nm, which is much smaller than the spin diffusion length in the spin accumulation layer. Because of the very long spin diffusion length of the spin accumulation layer 250, the angular momentum transferred into the spin accumulation layer 250 by spin pumping from the time dependent magnetization of the free layer 240 is long lived, and can accumulate. As a result, there is some nonzero probability for this accumulated angular momentum to be transported outward toward the spin barrier layer 260. Similarly, there is some nonzero probability that this accumulated angular momentum to be transported inward back into the free layer 240.

The spin barrier layer 260 is analogous to the spin barrier layers 150, 150', and 150" and thus functions similarly. In a preferred embodiment, the spin barrier layer 260 preferably has a large areal resistance, $r_b$. In particular, the areal resistance of the spin barrier layer 260, expressed in $\Omega\mu m^2$, is sufficiently large that the dimensionless product $g_r^{\uparrow\downarrow} r_b$ is larger than ten. The quantity $g_r^{\uparrow\downarrow}$ is the spin mixing conductance of the interface between the free layer 240 and the spin accumulation layer 250, expressed in $\Omega^{-1} \mu m^{-2}$. The spin mixing conductance has been defined in the context of the magneto-electronic theory of magnetoresistance effect film structures, as explained in details in: "Spin torques in ferromagnetic/metal structures", by K. Xia et al., Phys. Rev. B 65, 220401(R) (2002). Typical values of the spin mixing conductance for metal/metal interface in the range of one hundred to one thousand $\Omega^{-1} \mu m^{-2}$. Consequently, in a preferred embodiment of the invention, the spin barrier layer 260 has an areal resistance larger than 0.01 $\Omega\mu m^2$, and possibly larger than 0.1 $\Omega\mu m^2$, to achieve the dimensionless product of approximately ten.

With a spin barrier layer 260 satisfying the large areal resistance requirement used in conjunction with the spin accumulation layer 250, the probability for the angular momentum accumulated in the spin accumulation layer 250 to be transported inward back into the magnetic free layer 240 becomes much larger than the probability to be transferred outward through the spin barrier layer 260. Stated differently, it becomes significantly more likely that angular momentum accumulated in the spin accumulation layer 250 will be returned to the free layer 240. This results in an effective cancellation of the spin pumping induced additional damping and, therefore, a reduction in the outer surface contribution to the damping parameter, $\delta\alpha^{out}$. Consequently, in a beneficial reduction in the critical current magnitude $I_c$ to switch the free layer 240 magnetization is achieved.

In the embodiment shown, the spin barrier layer 260 is essentially a current confined layer. Thus, the spin barrier layer 260 is analogous to the spin barrier layer 150 depicted in FIG. 3A. Referring back to FIG. 4A, the spin barrier layer 260 is a thin layer inhomogeneous across the plane of the layer 260. The spin barrier layer 260 thus has areas of metallic (ohmic) conduction, termed conductive channels 262, and areas of high resistivity, termed an insulating matrix 264. The insulating matrix 264 may actually be insulating areas or may simply have a resistivity that is high in comparison to the conductive channels 262. As a result, conduction of current through the spin barrier layer 260 is primarily confined to the conductive channels 262. In a magnetic element 200, the areal resistance of the spin barrier layer 260 can be adjusted by varying the size and density of the conductive channels 262 allowing the targeted specification for $r_b$ to be met relatively easily.

In a preferred embodiment of the magnetic element 200, the current confined spin barrier layer 260 has a thickness that is preferably between 0.2 and 5 nm. Also in a preferred embodiment, the spin barrier layer 260 is made in large part from an oxide of one of more materials selected from a group consisting of Al, B, Si, Ge, W, Nb, Mo, Ta, V, Ti, Cr, Fe, Co, and Ni. The conductive channels 262 may correspond to areas of lower atomic concentration in oxygen. In a preferred embodiment to areas of oxygen atomic concentration below thirty percent are considered to be the conductive channels 262. The areas of high resistivity, the insulating matrix 264, may correspond to areas of higher atomic concentration in oxygen. In a preferred embodiment, the insulating matrix 264 corresponds to areas of atomic oxygen concentration above forty percent. Moreover, the lateral fluctuation in oxygen atomic concentration across the spin barrier layer 260 are preferably induced by addition to the spin barrier layer 260 of metallic element(s), or oxygen segregation agent, that does not oxidize easily. For example, the conductive channels 262 may include element(s) selected from the group consisting of Cu, Ag, Au, Pt, Pd, Ir, and Os.

In an alternate embodiment of the current confined spin barrier layer 260, the current confined spin barrier layer 260 preferably has a thickness comprised between 0.2 and 5 nm. Also in such an embodiment, the spin barrier layer 260 is made in large part from a nitride of elements (the matrix elements) selected from the group consisting of Al, B, Si, Ge, Ti. The conductive channels 262 correspond to areas of lower atomic concentration in nitrogen. In a preferred embodiment, the conductive channels 262 correspond to areas of nitrogen atomic concentration below thirty percent. The insulating matrix 264 corresponds to areas of high resistivity, preferably where the atomic nitrogen concentration is above forty percent. Moreover, the lateral fluctuations in nitrogen atomic concentration across the spin barrier layer 260 are preferably induced by addition to the spin barrier layer 260 of a metallic element, or the nitrogen segregation agent, that does not react easily with nitrogen. For example, element(s) selected from the group consisting of Cu, Ag, Au, Pt, Pd, Ir, and Os.

In operation, different currents for reading and writing are used. During reading, the lower read current is utilized. For example, a current of between one and five hundred microamperes may be used as the read current. Such a read current allows the state of the magnetic element 200 to be determined yet does not result in spin transfer induced switching of the free layer 240. During writing, a write current that is at least equal to the critical current, $I_c$, is applied in the appropriate direction (i.e. up or down in FIG. 4A) to write to the magnetic element 200. Thus, the magnetization 242 of the free layer 240 can be switched to be parallel or antiparallel to the magnetization 222 of the pinned layer 220. Such a write current may be between ten and two thousand microamperes.

Thus, the combination of the spin accumulation layer 250 that accumulates spin angular momentum, and spin barrier layer 260 that allows the accumulated spin angular momentum to have a higher probability of returning to the free layer 240 helps reduce an outer surface contribution to the damping constant, $\alpha$, of the free layer. As a result, the critical current at which the magnetization 242 of the free layer 240 switches is reduced. Consequently, performance of the magnetic element 200 can be improved.

Figure 4B:
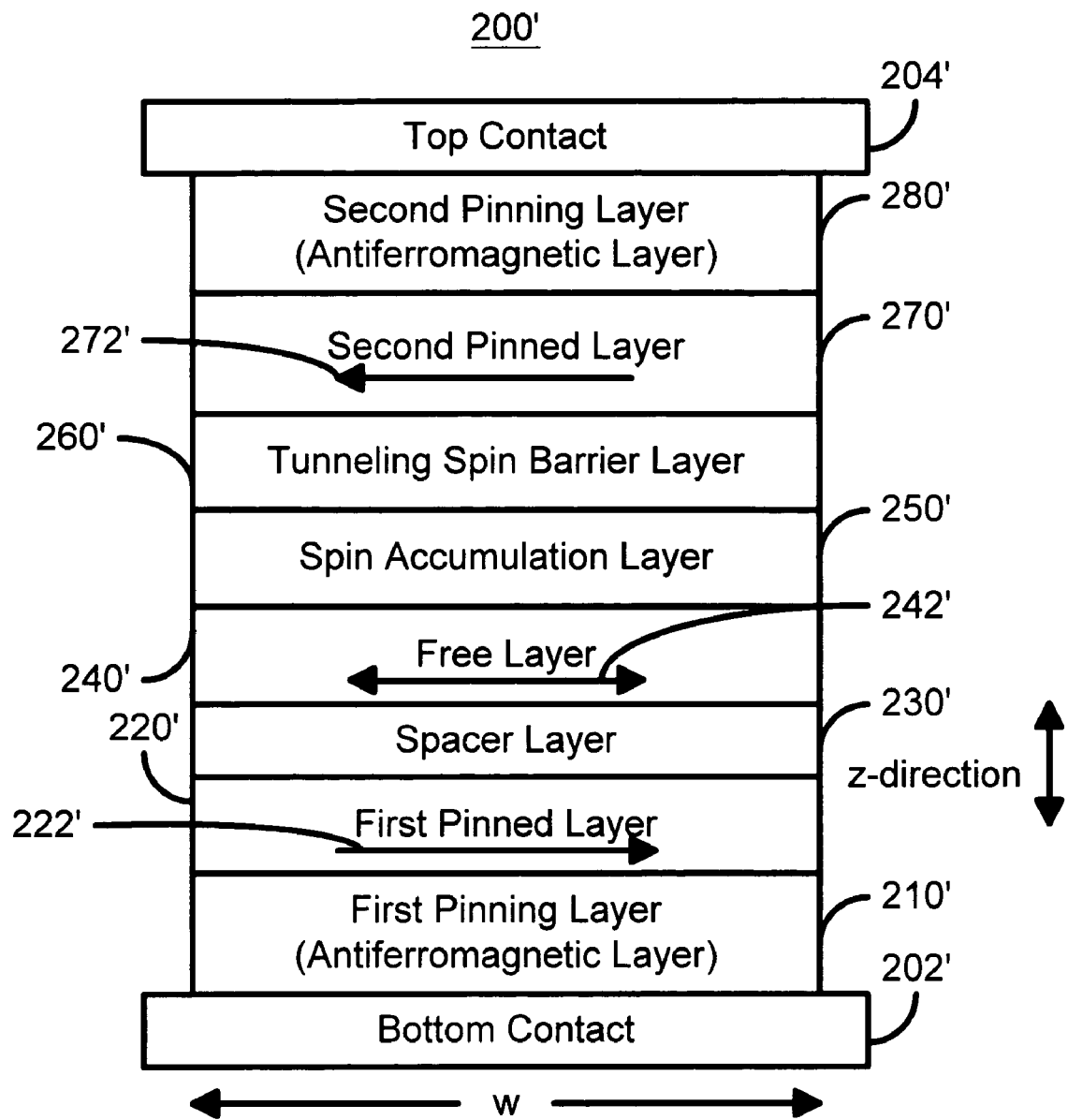
FIG. 4B depicts another version of the second embodiment of a portion of a magnetic element in accordance with the present invention having a reduced write current density for spin transfer switching.

FIG. 4B depicts another version of the second embodiment of a portion of a magnetic element 200' in accordance with the present invention having a reduced write current density for spin transfer switching. Components of the magnetic element 200' are analogous to the magnetic element 200. Consequently, portions of the magnetic element 200' are labeled similarly to the magnetic element 200. Thus, the magnetic element 200' includes a first pinning layer 210' that is preferably an AFM layer, a first pinned layer 220', a spacer layer 230', a free layer 240', a spin accumulation layer 250', a spin barrier layer 260', a second pinned layer 270', and a second pinning layer 280' that is preferably an AFM layer. Current is preferably driven in a CPP configuration using electrodes 202' and 204'. The spacer layer 230' may take on various forms, including a conductive layer, a tunneling barrier layer, or a current confined layer. Thus, the layers of the magnetic element 200' are substantially the same as and function in an analogous manner to the layers of the magnetic element 200.

Although the combination of the spin accumulation layer 250' and the spin barrier layer 260' functions in an analogous manner to spin accumulation layer 250 and the spin barrier layer 250 combination, the structure of the spin barrier layer 260' is different. In particular, the spin barrier layer 260' is a tunneling barrier that includes a thin insulating, a semiconducting layer, or other analogous layer. Conduction of current through the spin barrier layer 260' is thus allowed by electronic tunneling, electron hoping and/or thermally activated conduction. In such a magnetic element 200', the areal resistance of the spin barrier layer 260' may be adjusted by varying the thickness and composition of the spin barrier layer 260'. Thus, the targeted specification for $r_b$ may be met.

In a preferred embodiment of the magnetic element 200', the spin barrier layer 260' has a thickness between 0.2 and 5 nm. Also in a preferred embodiment, the spin barrier layer is in large part comprised of an oxide of elements selected from the group consisting of Al, B, Si, Ge, W, Nb, Mo, Ta, V, Ti, Cr, Fe, Co, or Ni. In an alternate embodiment of the magnetic element 200', the spin barrier layer 260' has a thickness between 0.2 and 5 nm, and is made in large part from a nitride of element(s) selected from the group consisting of A, B, Si, Ge, Ti. In yet another embodiment, the spin barrier layer 260' is made in large part from a semiconductor material. In such a magnetic element 200', the spin barrier layer 260' preferably has a thickness of between 0.2 and 5 nm. The semiconductor material used in such an embodiment is preferably made out of element(s) selected from the group constituted Si, Ge, Ga, Cd, Te, Sb, In, Al, As, Hg, and C.

The combination of the spin accumulation layer 250' and the spin barrier layer 260' reduces an outer surface contribution to the damping constant, $\alpha$, of the free layer 240' in a manner similar to that described above with respect to FIG. 4A. Because the spin accumulation layer 250' with the spin barrier layer 260' reduces the outer surface contribution to the damping constant in a manner analogous to that described above, the critical current at which the magnetization 242' of the free layer 240' switches is reduced. Consequently, performance of the magnetic element 200' can be improved.

Figure 4C:
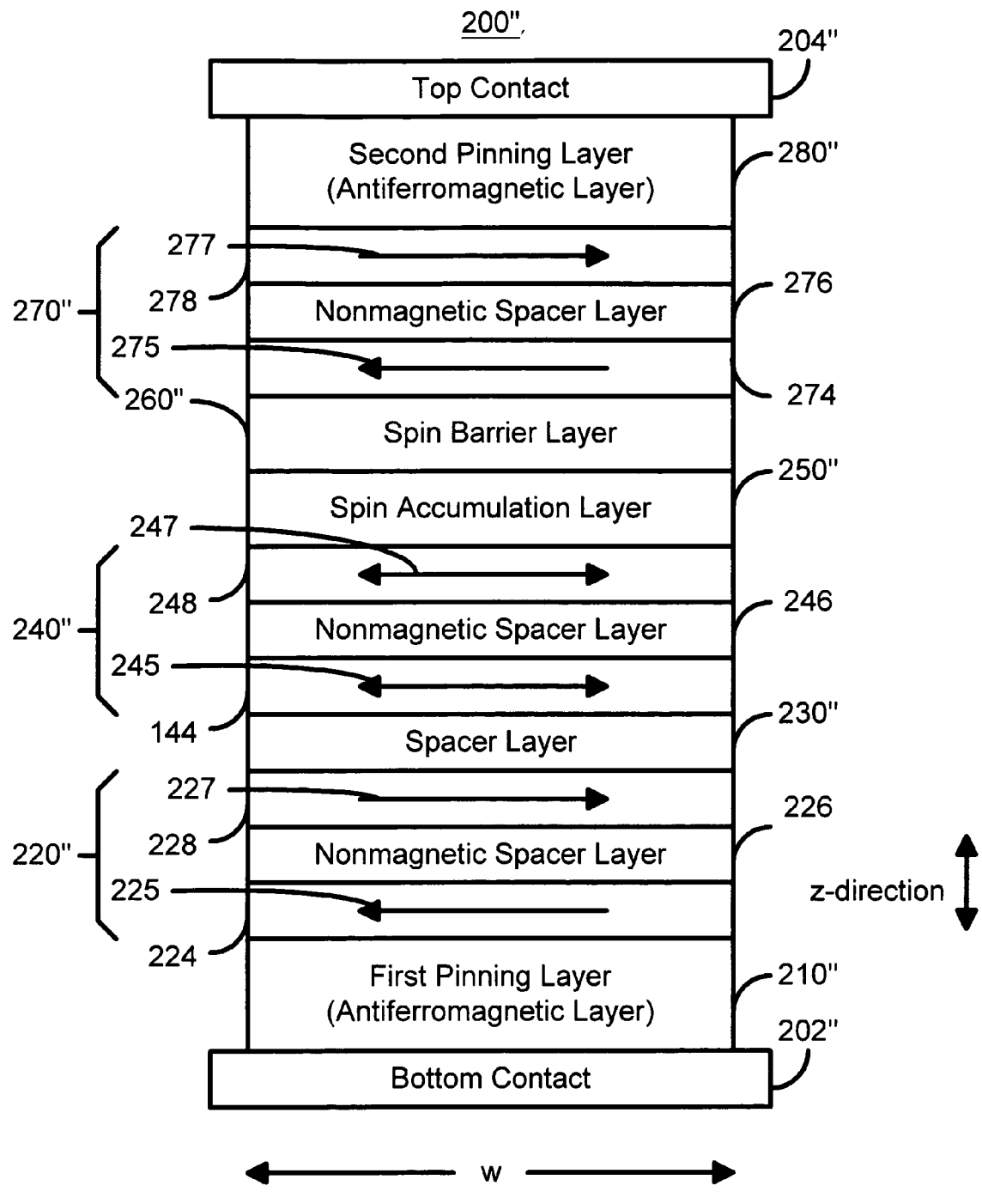
FIG. 4C depicts a third version of the second embodiment of a portion of a magnetic element in accordance with the present invention having a reduced write current density for spin transfer switching.

FIG. 4C depicts a third version of the second embodiment of a portion of a magnetic element 200" in accordance with the present invention having a reduced write current density for spin transfer switching. Components of the magnetic element 200" are analogous to the magnetic element 200. Consequently, portions of the magnetic element 200" are labeled similarly to the magnetic elements 200 and 200'.

Thus, the magnetic element 200" includes a first pinning layer 210" that is preferably an AFM layer, a first pinned layer 220", a spacer layer 230", a free layer 240", a spin accumulation layer 250", a spin barrier layer 260", a second pinned layer 270", and a second pinning layer 280" that is preferably an AFM layer. Current is preferably driven in a CPP configuration using electrodes 202" and 204". The spacer layer 230" may take on various forms, including a conductive layer, a tunneling barrier layer, or a current confined layer. Thus, the layers of the magnetic element 200" are substantially the same as and function in an analogous manner to the layers of the magnetic element 200 and 200'.

The spin barrier layer 260" may be a current confined spin barrier layer, such as the spin barrier layer 250, or a tunneling spin barrier layer, such as the spin barrier layer 250'. Thus, the spin barrier layer 260" in combination with the spin accumulation layer 250" functions in a similar manner to the spin barrier layers 250 and 250'. However, in the magnetic element 200" shown, the first pinned layer 220", the free layer 240", and the second pinned layer 270" are synthetic. Consequently, the pinned layer 220" includes ferromagnetic layers 224 and 228 separated by a nonmagnetic spacer layer 226 that is preferably Ru. The nonmagnetic spacer layer 226 is configured so that the magnetizations 225 and 227 of the ferromagnetic layers 224 and 228, respectively, are antiferromagnetically coupled. The pinned layer 270" includes ferromagnetic layers 274 and 278 separated by a nonmagnetic spacer layer 276 that is preferably Ru. The nonmagnetic spacer layer 276 is configured so that the magnetizations 275 and 277 of the ferromagnetic layers 274 and 278, respectively, are antiferromagnetically coupled. Similarly, the free layer 240" includes ferromagnetic layers 244 and 248 separated by a nonmagnetic spacer layer 246 that is preferably Ru. The nonmagnetic spacer layer 246 is configured so that magnetizations 245 and 247 of the ferromagnetic layers 244 and 248, respectively, are antiferromagnetically coupled.

Thus, in a manner analogous to described above for the magnetic element 200, the spin barrier layer 260" and the spin accumulation layer 250" combination reduces an outer surface contribution to the damping constant, $\alpha$, of the free layer 240". As a result, the critical current at which the magnetization 242" of the free layer 240" switches is reduced. Consequently, performance of the magnetic element 200" can be improved.

Thus, using the magnetic elements 100, 100', 100", 200, 200', and 200" the critical current to switch the magnetization direction for the corresponding free layer 130, 130', 130", 230, 230', and 230", is reduced. Consequently, improved power consumption as well as the remaining benefits of lower $I_c$ can be achieved.

Figure 5:
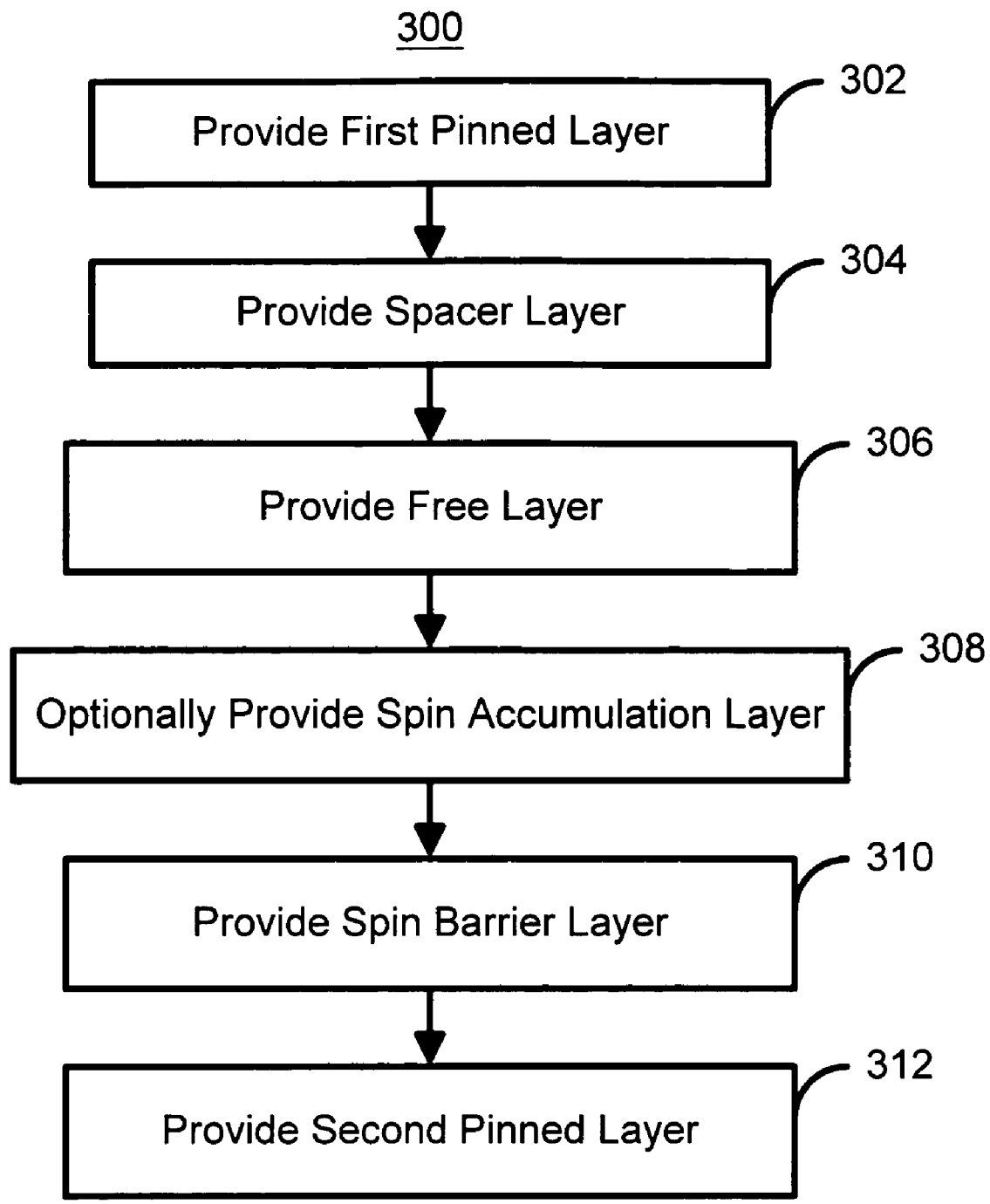
FIG. 5 depicts a flow chart of a one embodiment of a method in accordance with the present invention for providing one embodiment of a magnetic element in accordance with the present invention having a reduced write current density for spin transfer switching.

FIG. 5 depicts a flow chart of a one embodiment of a method in accordance with the present invention for providing one embodiment of a magnetic element in accordance with the present invention. The method 600 is described in the context of the magnetic elements 100, 100', 100", 200, 200', and 200". A first pinned layer, such as the pinned layer 120, 120', 120", 220, 220', and/or 220" is provided, via step 302. In one embodiment, step 302 includes providing a synthetic pinned layer. The spacer layer 130, 130', 130", 230, 230', and/or 230" is provided, via step 304. Step 304 can include providing a barrier layer, a conducting layer, or a current confined layer. The free layer 140, 140', 140", 240, 240', and/or 240" is provided, via step 306. The spin accumulation layer 250, 250', or 250" is optionally provided, depending upon the embodiment being fabricated, via step 308. In one embodiment, step 308 includes sputtering the spin accumulation layer 250, 250', or 250" in a high vacuum deposition chamber from a high purity metal target. The spin barrier layer 150, 150', 150", 260, 260', and/or 260" is provided, via step 310. Thus, step 310 can be used to form the spin diffusion layers 150 or 250. In one embodiment, step 310 includes alternate co-sputtering the selected matrix element(s) in a high vacuum deposition chamber of sub-monolayers from a high purity target of the selected matrix element(s) with a high purity target of the selected oxygen segregation agent. The co-sputtering is tuned such that the selected proportions and the selected total thickness can be achieved. In such an embodiment, deposition would be followed by natural oxidation. In another embodiment, step 310 includes alternate reactive co-sputtering in a high vacuum deposition chamber sub-monolayers from a high purity target of the selected matrix element(s) and from a high purity target of the selected nitrogen segregation agent. The co-sputtering is tuned so that the selected proportions and the selected total thickness can be achieved. Note that using a mixture of argon and nitrogen as a sputtering gas, can be used in nitriding the matrix. Such embodiments result in a current confined layer as the spin barrier layer 150 or 260. In another embodiment, step 310 provides a tunneling layer 150' or 260' by sputtering in a high vacuum deposition chamber from a high purity target of the selected matrix element(s), followed by natural oxidation in a rarefied atmosphere of pure oxygen. To provide another tunnel spin barrier layer, reactive sputtering in a high vacuum deposition chamber from a high purity target of the selected matrix element(s), using a mixture of argon and nitrogen as a sputtering gas, can be used. Yet another tunnel spin barrier layer 150' or 160' can be provided by sputtering in a high vacuum deposition chamber from a high purity target of the selected semiconductor material. The second pinned layer, such as the pinned layer 160, 160', 160", 270, 270', and/or 270" is provided, via step 312. The remaining portion(s) of the magnetic element and corresponding magnetic memory (not explicitly shown). Thus, the magnetic elements 100, 100', 100", 200, 200', 200" may be provided.

A method and system has been disclosed for providing a magnetic element that can be written using spin transfer at a lower switching current density. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A magnetic element comprising:
a first pinned layer;
a spacer layer, the spacer layer being nonmagnetic; and
a free layer having a free layer magnetization, the spacer layer residing between the pinned layer and the free layer;
a spin barrier layer, the free layer residing between the spin barrier layer and the spacer layer, the spin barrier layer configured to reduce an outer surface contribution to a damping constant of the free layer; and
a second pinned layer, the spin barrier layer residing between the free layer and the second pinned layer;
wherein the magnetic element is configured to allow the free layer magnetization to be switched due to spin transfer when a write current is passed through the magnetic element.

2. The magnetic element of claim 1 wherein the spin barrier layer has a high areal resistance.

3. The magnetic element of claim 1 wherein the spin barrier layer is configured such that spin pumping induced damping is substantially eliminated.

4. The magnetic element of claim 1 wherein the spin barrier layer is a current confined layer including conductive channels in an insulating matrix.

5. The magnetic element of claim 4 wherein the spin barrier layer includes an oxide of materials from a group consisting of Al, B, Si, Ge, W, Nb, Mo, Ta, V, Ti, Cr, Fe, Co, and/or Ni.

6. The magnetic element of claim 5 wherein the spin barrier layer further includes Cu, Ag, Au, Pt, Pd, Ir, and/or Os.

7. The magnetic element of claim 4 wherein the spin barrier layer includes a nitride of materials from a group consisting of Al, B, Si, Ge, Ti.

8. The magnetic element of claim 7 wherein the spin barrier layer further includes Cu, Ag, Au, Pt, Pd, Ir, and/or Os.

9. The magnetic element of claim 1 wherein the spin barrier layer is a tunneling barrier such that conduction through the spin barrier layer includes tunneling hopping, and/or thermally activated conduction.

10. The magnetic element of claim 9 wherein the spin barrier layer is an insulator.

11. The magnetic element of claim 9 wherein the spin barrier layer includes an oxide from a group of materials including Al, B, Si, Ge, W, Nb, Mo, Ta, V, Ti, Cr, Fe, Co, Ni.

12. The magnetic element of claim 9 wherein the spin barrier layer includes a nitride of materials from a group consisting of Al, B, Si, Ge, Ti.

13. The magnetic element of claim 9 wherein the spin barrier layer is semiconducting.

14. The magnetic element of claim 13 wherein the spin barrier layer includes a material selected from the group of Si, Ge, Ga, Cd, Te, Sb, In, Al, As, Hg, and C.

15. The magnetic element of claim 1 wherein the spacer layer is a conductor, an insulating barrier layer, or a current confined layer.

16. A magnetic element comprising:
a first pinned layer;
a spacer layer, the spacer layer being nonmagnetic; and
a free layer having a free layer magnetization, the spacer layer residing between the pinned layer and the free layer;
a spin barrier layer, the free layer residing between the spin barrier layer and the spacer layer, the spin barrier layer configured to reduce an outer surface contribution to a damping constant of the free layer and having a high areal resistance; and
a second pinned layer, the spin barrier layer residing between the free layer and the second pinned layer;
wherein the magnetic element is configured to allow the free layer magnetization to be switched due to spin transfer when a write current is passed through the magnetic element;
wherein the high areal resistance is greater than or equal to 0.1 $\Omega\mu m^2$.

17. A magnetic element comprising:
a first pinned layer;
a spacer layer, the spacer layer being nonmagnetic; and
a free layer having a free layer magnetization, the spacer layer residing between the pinned layer and the free layer;

a spin barrier layer, the free layer residing between the spin barrier layer and the spacer layer, the spin barrier layer configured to reduce an outer surface contribution to a damping constant of the free layer, the spin barrier layer including an oxide of materials from a group consisting of Al, B, Si, Ge, W, Nb, Mo, Ta, V, Ti, Cr, Fe, Co, and/or Ni; and a second pinned layer, the spin barrier layer residing between the free layer and the second pinned layer;

wherein the magnetic element is configured to allow the free layer magnetization to be switched due to spin transfer when a write current is passed through the magnetic element;

wherein the conductive channels include regions in which the oxide is less than thirty atomic percent oxygen.

18. A magnetic element comprising:

a first pinned layer;

a spacer layer, the spacer layer being nonmagnetic; and a free layer having a free layer magnetization, the spacer layer residing between the pinned layer and the free layer;

a spin barrier layer, the free layer residing between the spin barrier layer and the spacer layer, the spin barrier layer configured to reduce an outer surface contribution to a damping constant of the free layer and including a nitride or materials from a group consisting of Al, B, Si, Ge, and Ti; and a second pinned layer, the spin barrier layer residing between the free layer and the second pinned layer;

wherein the magnetic element is configured to allow the free layer magnetization to be switched due to spin transfer when a write current is passed through the magnetic element;

wherein the conductive channels include regions in which the nitride is less than thirty atomic percent nitrogen.

19. A magnetic element comprising:

a first pinned layer;

a spacer layer, the spacer layer being nonmagnetic; and a free layer having a free layer magnetization, the spacer layer residing between the pinned layer and the free layer;

a spin barrier layer, the free layer residing between the spin barrier layer and the spacer layer, the spin barrier layer configured to reduce an outer surface contribution to a damping constant of the free layer; and a second pinned layer, the spin barrier layer residing between the free layer and the second pinned layer;

wherein the magnetic element is configured to allow the free layer magnetization to be switched due to spin transfer when a write current is passed through the magnetic element;

wherein the free layer is a synthetic free layer including a first ferromagnetic layer, a second ferromagnetic layer, and a nonmagnetic spacer layer between the first ferromagnetic layer and the second ferromagnetic layer, the nonmagnetic spacer layer being configured such that the first ferromagnetic layer and the second ferromagnetic layer are antiferromagnetically coupled.

20. A magnetic element comprising:

a first pinned layer;

a spacer layer, the spacer layer being nonmagnetic; and a free layer having a free layer magnetization, the spacer layer residing between the pinned layer and the free layer;

a spin barrier layer, the free layer residing between the spin barrier layer and the spacer layer, the spin barrier layer configured to reduce an outer surface contribution to a damping constant of the free layer; and a second pinned layer, the spin barrier layer residing between the free layer and the second pinned layer;

wherein the magnetic element is configured to allow the free layer magnetization to be switched due to spin transfer when a write current is passed through the magnetic element;

wherein the pinned layer is a synthetic pinned layer including a first ferromagnetic layer, a second ferromagnetic layer, and a nonmagnetic spacer layer between the first ferromagnetic layer and the second ferromagnetic layer, the nonmagnetic spacer layer being configured such that the first ferromagnetic layer and the second ferromagnetic layer are antiferromagnetically coupled.

21. A magnetic element comprising:

a first pinned layer;

a spacer layer, the spacer layer being nonmagnetic; and a free layer having a free layer magnetization, the spacer layer residing between the pinned layer and the free layer;

a spin barrier layer, the free layer residing between the spin barrier layer and the spacer layer, the spin barrier layer configured to reduce an outer surface contribution to a damping constant of the free layer;

a second pinned layer, the spin barrier layer residing between the free layer and the second pinned layer; and a spin accumulation layer residing between the spin barrier layer and the free layer, the spin accumulation layer having a high conductivity;

wherein the magnetic element is configured to allow the free layer magnetization to be switched due to spin transfer when a write current is passed through the magnetic element.

22. The magnetic element of claim 21 wherein the spin accumulation layer has a long spin diffusion length.

23. The magnetic element of claim 21 wherein the spin accumulation layer includes Al, Cu, or Ag.

24. The magnetic element of claim 21 wherein the spin barrier layer has a high areal resistance that is greater than or equal to 0.01 $\mu m^2$.

25. The magnetic element of claim 21 wherein the spin barrier layer is configured such that spin pumping induced damping is substantially eliminated.

26. The magnetic element of claim 21 wherein the spin barrier layer is a current confined layer including conductive channels in an insulating matrix.

27. The magnetic element of claim 26 wherein the spin barrier layer includes an oxide of materials from a group consisting of Al, B, Si, Ge, W, Nb, Mo, Ta, V, Ti, Cr, Fe, Co, and/or Ni.

28. The magnetic element of claim 27 wherein the conductive channels include regions in which the oxide is less than thirty atomic percent oxygen.

29. The magnetic element of claim 27 wherein the spin barrier layer further includes Cu, Ag, Au, Pt, Pd, Ir, and/or Os.

30. The magnetic element of claim 26 wherein the spin barrier layer includes a nitride of materials from a group consisting of Al, B, Si, Ge, Ti.

31. The magnetic element of claim 30 wherein the conductive channels include regions in which the nitride is less than thirty atomic percent nitrogen.

32. The magnetic element of claim 30 wherein the spin barrier layer further includes Cu, Ag, Au, Pt, Pd, Ir, and/or Os.

33. The magnetic element of claim 21 wherein the spin barrier layer is a tunneling barrier such that conduction through the spin barrier layer includes tunneling hopping, and/or thermally activated conduction.

34. The magnetic element of claim 33 wherein the spin barrier layer is an insulator.

35. The magnetic element of claim 33 wherein the spin barrier layer includes an oxide from a group of materials including Al, B, Si, Ge, W, Nb, Mo, Ta, V, Ti, Cr, Fe, Co, Ni.

36. The magnetic element of claim 33 wherein the spin barrier layer includes a nitride of materials from a group consisting of Al, B, Si, Ge, Ti.

37. The magnetic element of claim 33 wherein the spin barrier layer is semiconducting.

38. The magnetic element of claim 37 wherein the spin barrier layer includes at least one element selected from the group of Si, Ge, Ga, Cd, Te, Sb, In, Al, As, Hg, and C.

39. The magnetic element of claim 21 wherein the spacer layer is a conductor, an insulating barrier layer, or a current confined layer.

40. The magnetic element of claim 21 wherein the free layer is a synthetic free layer including a first ferromagnetic layer, a second ferromagnetic layer, and a nonmagnetic spacer layer between the first ferromagnetic layer and the second ferromagnetic layer, the nonmagnetic spacer layer being configured such that the first ferromagnetic layer and the second ferromagnetic layer are antiferromagnetically coupled.

41. The magnetic element of claim 21 wherein the pinned layer is a synthetic pinned layer including a first ferromagnetic layer, a second ferromagnetic layer, and a nonmagnetic spacer layer between the first ferromagnetic layer and the second ferromagnetic layer, the nonmagnetic spacer layer being configured such that the first ferromagnetic layer and the second ferromagnetic layer are antiferromagnetically coupled.

42. A method for providing magnetic element comprising:
(a) providing a first pinned layer;
(b) providing a spacer layer, the spacer layer being nonmagnetic; and
(c) providing a free layer having a free layer magnetization, the spacer layer residing between the pinned layer and the free layer; and
(d) providing a spin barrier layer, the free layer residing between the spin barrier layer and the spacer layer, the spin barrier layer configured to reduce an outer surface contribution to a damping constant of the free layer and having an areal resistance is greater than or equal to 0.1 $\Omega\mu m^2$;
(e) providing a second pinned layer;
wherein the magnetic element is configured to allow the free layer magnetization to be switched due to spin transfer when a write current is passed through the magnetic element.

43. A method for providing magnetic element comprising:
(a) providing a first pinned layer;
(b) providing a spacer layer, the spacer layer being nonmagnetic; and
(c) providing a free layer having a free layer magnetization, the spacer layer residing between the pinned layer and the free layer;
(d) providing a spin barrier layer, the free layer residing between the spin barrier layer and the spacer layer, the spin barrier layer configured to reduce an outer surface contribution to a damping constant of the free layer;
(e) providing a second pinned layer; and
(f) providing a spin accumulation layer residing between the spin barrier layer and the free layer, the spin accumulation layer having a high conductivity;
wherein the magnetic element is configured to allow the free layer magnetization to be switched due to spin transfer when a write current is passed through the magnetic element.

44. A magnetic element comprising:
a first pinned layer;
a spacer layer, the spacer layer being nonmagnetic; and
a free layer having a free layer magnetization, the spacer layer residing between the pinned layer and the free layer;
a spin barrier layer, the free layer residing between the spin barrier layer and the spacer layer, the spin barrier layer configured to reduce an outer surface contribution to a damping constant of the free layer; and
a second pinned layer, the spin barrier layer residing between the free layer and the second pinned layer;
wherein the magnetic element is configured to allow the free layer magnetization to be switched at least in part due to spin transfer when a write current is passed through the magnetic element.

45. The magnetic element of claim 44 further comprising:
a spin accumulation layer residing between the spin barrier layer and the free layer, the spin accumulation layer having a high conductivity.

* * * * *